United States Patent
Lee et al.

(10) Patent No.: US 8,398,833 B2
(45) Date of Patent: Mar. 19, 2013

(54) USE OF DC MAGNETRON SPUTTERING SYSTEMS

(75) Inventors: Eal H. Lee, Milpitas, CA (US); Jaeyeon Kim, Liberty Lake, WA (US)

(73) Assignee: Honeywell International Inc., Morristown, NJ (US)

( * ) Notice: Subject to any disclaimer, the term of this patent is extended or adjusted under 35 U.S.C. 154(b) by 111 days.

(21) Appl. No.: 12/988,016

(22) PCT Filed: Apr. 14, 2009

(86) PCT No.: PCT/US2009/040455
§ 371 (c)(1),
(2), (4) Date: Oct. 15, 2010

(87) PCT Pub. No.: WO2009/151767
PCT Pub. Date: Dec. 17, 2009

(65) Prior Publication Data
US 2011/0031109 A1    Feb. 10, 2011

(51) Int. Cl.
*C23C 14/35* (2006.01)
(52) U.S. Cl. ............ 204/298.12; 204/192.1; 204/192.12
(58) Field of Classification Search ............ 204/298.12, 204/298.19, 192.1, 192.12
See application file for complete search history.

(56) References Cited

U.S. PATENT DOCUMENTS

| | | | |
|---|---|---|---|
| 6,149,776 A * | 11/2000 | Tang et al. | 204/192.12 |
| 6,340,415 B1 | 1/2002 | Raaijmakers et al. | |
| 6,497,797 B1 | 12/2002 | Kim | |
| 6,620,296 B2 * | 9/2003 | Gogh et al. | 204/192.1 |
| 6,702,930 B1 | 3/2004 | Cheng et al. | |
| 6,811,657 B2 | 11/2004 | Jaso | |
| 6,872,284 B2 | 3/2005 | Ivanov et al. | |
| 6,916,407 B2 | 7/2005 | Voser et al. | |
| 7,347,353 B2 | 3/2008 | Yamakoshi et al. | |
| 7,618,520 B2 | 11/2009 | Wu et al. | |
| 2003/0178301 A1 | 9/2003 | Lynn et al. | |
| 2004/0009087 A1 * | 1/2004 | Yi et al. | 419/8 |
| 2004/0089543 A1 | 5/2004 | Kim et al. | |
| 2004/0094402 A1 | 5/2004 | Gopalraja et al. | |
| 2004/0265616 A1 | 12/2004 | Yamakoshi et al. | |
| 2007/0051624 A1 | 3/2007 | Okabe et al. | |

(Continued)

FOREIGN PATENT DOCUMENTS

JP    06-140330    *    5/1994
JP    06140330 A        5/1994

(Continued)

OTHER PUBLICATIONS

Machine Translation JP 06-140330 dated May 1994.*

(Continued)

*Primary Examiner* — Rodney McDonald
(74) *Attorney, Agent, or Firm* — Faegre Baker Daniels LLP

(57) ABSTRACT

Field-enhanced sputtering targets are disclosed that include: a core material; and a surface material, wherein at least one of the core material or the surface material has a field strength design profile and wherein the sputtering target comprises a substantially uniform erosion profile. Target assembly systems are also disclosed that include a field-enhanced sputtering target; and an anodic shield. Additionally, methods of producing a substantially uniform erosion on a sputtering target are described that include: providing an anodic shield; providing a cathodic field-enhanced target; and initiating a plasma ignition arc, whereby the arc is located at the point of least resistance between the anodic shield and the cathodic field-enhanced target.

20 Claims, 24 Drawing Sheets

U.S. PATENT DOCUMENTS

| | | |
|---|---|---|
| 2008/0116066 A1 | 5/2008 | Miyashita |
| 2008/0173541 A1 | 7/2008 | Lee et al. |
| 2009/0229975 A1 | 9/2009 | Yamakoshi |
| 2009/0277788 A1 | 11/2009 | Oda et al. |

FOREIGN PATENT DOCUMENTS

| | | |
|---|---|---|
| JP | 11193457 A | 7/1999 |
| JP | 2001011617 A | 1/2001 |
| JP | 2003027225 A | 1/2003 |
| JP | 2004084007 A | 3/2004 |
| JP | 2007-146294 A | 6/2007 |
| WO | WO0242518 A1 | 5/2005 |
| WO | WO2006054409 A1 | 5/2006 |

OTHER PUBLICATIONS

Meidlinger, Marx, Blanchet; "Enhanced Targets Can Reduce Metallisation Cost of Ownership—A Case Study"; Semiconductor FABTECH, Jun. 14, 2000; Wafer Processing.

Plaisted; "Surface Profiling Enhancement on Sputter and Arc Deposition Targets"; Society of Vacuum Coaters; 43rd Annual Technical Conference Proceedings; Apr. 15, 2000 through Apr. 20, 2000.

German; "A Simple Low Cost Method for Increased Performance of Planar Manetron Sputtering Targets"; 1995 Society of Vacuum Coaters; 38th Annual Technical Conference Proceedings (1995); ISSN 0737-5921.

* cited by examiner

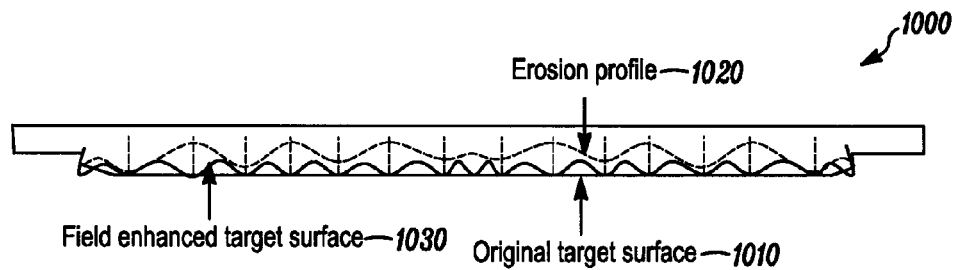
FIG. 10
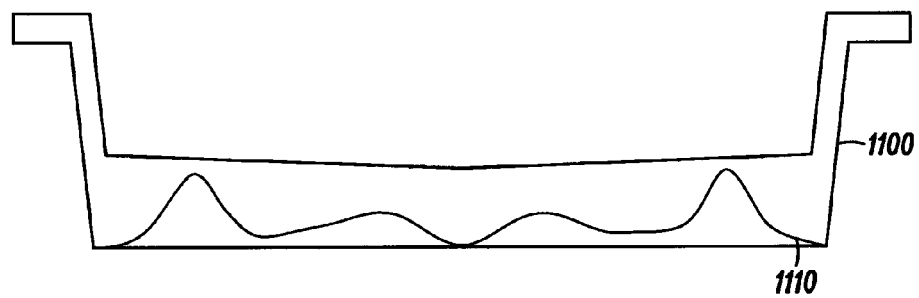
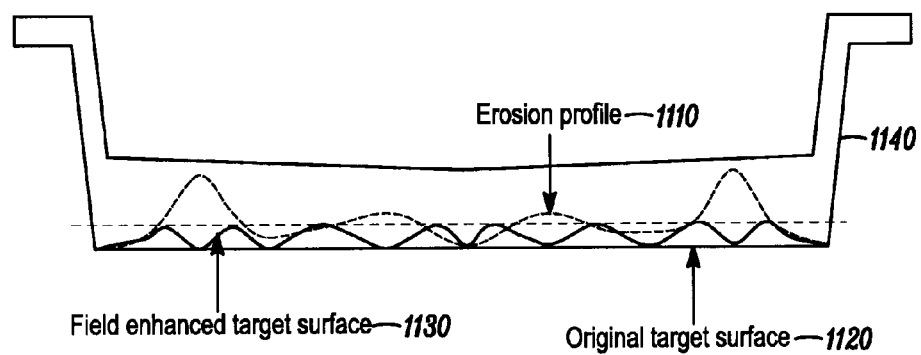
FIG. 11

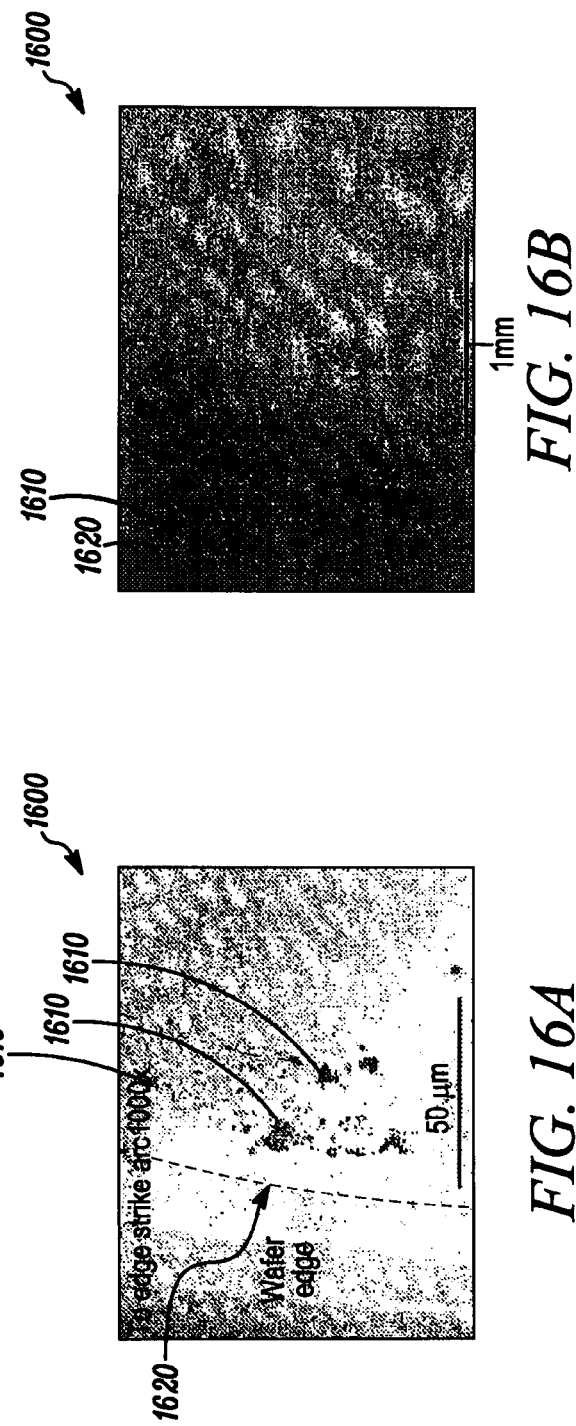

| Target Type | Target Wt Loss | Shield Wt Gain | Clamp Ring Wt Gain | Wafer Wt Gain | Target Usage Efficiency |
|---|---|---|---|---|---|
| Field Enhanced | 1078.4 | 306.9 | 431.8 | 339.7 | 31.5% |
| Standard | 993.7 | 253.6 | 420.9 | 319.2 | 32.1% |

Table 1 ns of DC MAGNETRON SPUTTERING
SYSTEMS

This application is a national phase application of Patent Cooperation Treaty Application PCT/US2009/040455 filed pursuant to 35 U.S.C. §371, that claims priority to U.S. Provisional Application Ser. No.: 61/046,727 filed on Apr. 21, 2008, which is commonly-owned and incorporated herein in its entirety by reference.

FIELD OF THE SUBJECT MATTER

The field of the subject matter is the design and use of DC magnetron sputtering systems, including targets, particle catch-rings and reduction of particle generation in these systems.

BACKGROUND

Electronic and semiconductor components are used in ever-increasing numbers of consumer and commercial electronic products, communications products and data-exchange products. Examples of some of these consumer and commercial products are televisions, computers, cell phones, pagers, palm-type or handheld organizers, portable radios, car stereos, or remote controls. As the demand for these consumer and commercial electronics increases, there is also a demand for those same products to become smaller and more portable for the consumers and businesses.

As a result of the size decrease in these products, the components that comprise the products must also become smaller and/or thinner. Examples of some of those components that need to be reduced in size or scaled down are microelectronic chip interconnections, semiconductor chip components, resistors, capacitors, printed circuit or wiring boards, wiring, keyboards, touch pads, and chip packaging.

When electronic and semiconductor components are reduced in size or scaled down, any defects that are present in the larger components are going to be exaggerated in the scaled down components. Thus, the defects that are present or could be present in the larger component should be identified and corrected, if possible, before the component is scaled down for the smaller electronic products.

In order to identify and correct defects in electronic, semiconductor and communications components, the components, the materials used and the manufacturing processes for making those components should be broken down and analyzed. Electronic, semiconductor and communication/data-exchange components are composed, in some cases, of layers of materials, such as metals, metal alloys, ceramics, inorganic materials, polymers, or organometallic materials. The layers of materials are often thin (on the order of less than a few tens of angstroms in thickness). In order to improve on the quality of the layers of materials, the process of forming the layer—such as physical vapor deposition of a metal or other compound—should be evaluated and, if possible, modified and improved.

In order to improve the process of depositing a layer of material, the surface and/or material composition must be measured, quantified and defects or imperfections detected. In the case of the deposition of a layer or layers of material, its not the actual layer or layers of material that should be monitored but the material and surface of that material that is being used to produce the layer of material on a substrate or other surface. For example, when depositing a layer of metal onto a surface or substrate by sputtering a target comprising that metal, the atoms and molecules being deflected or liberated from the target must travel a path to the substrate or other surface that will allow for an even and uniform deposition. Atoms and molecules traveling natural and expected paths after deflection and/or liberation from the target can unevenly deposit on the surface or substrate, including trenches and holes in the surface or substrate. For certain surfaces and substrates, it may be necessary to redirect the atoms and molecules leaving the target in order to achieve a more uniform deposition, coating and/or film on the surface or substrate.

In a DC magnetron sputtering system, deposition begins with plasma ignition that is triggered by electrical arcing between an anodic shield and a cathodic target. Particles are always generated during arcing and become a major source of defects responsible for the reduced yield in microelectronic chip fabrication. The strike arc induced particles are ejected at a high velocity, like shot gun pellets, guided by the gap between the shield and the target side wall. These particles not only land on the wafer surface, but their impact also causes severe plowing and chipping on the wafer, predominately on the outer edges of the wafer's top surface, producing additional particles, particularly silicon and oxygen containing particles. Some of the small airborne particles stick to the target and surrounding surfaces becoming additional arc sites, further negatively impacting yield management. To this end, it would be desirable to develop and utilize a deposition apparatus and sputtering chamber system that will maximize uniformity of the coating, film or deposition on a surface and/or substrate.

Others working in the field observed (1) excessive arcing marks around the bottom corner area of a target sidewall and (2) rubbing marks on the backing plate outside of the O-ring. They machined away these problem areas to remove arcing sites (not to redirect arcing sites) and to prevent the backing plate from rubbing the ceramic ring. This modification leads serendipitously to some improvement in particle reduction. However, there are some drawbacks to the modified design, including: a) the design concept is not based on the physics of arcing, so the design optimization is not realized; b) the sloped target sidewall acts as reflective plane for the strike-arc induced particles, redirecting some of the particles toward the wafer; c) the target edge cools faster than the center due to the lower plasma density at the edge and the conductive medium underneath, so sputter atoms condense easily on the edge causing nodule formation; d) although a ledge is introduced by machining the backing plate, the positive slope results in inefficient strike-arc sites (i.e., less sharp, lower electric potential field); and e) the gradual change of the positive slope and somewhat shallow trench depth make a poorly defined demarcation between arcing and non-arcing area.

In DC magnetron sputtering systems, the buildup of insulating layer on poorly eroding race tracks and subsequent arcing on such layer have been the important issues for both process engineers and target manufacturers. Well-eroding and poorly-eroding "race tracks" develop due to the nature of magnet configuration. On the poorly eroding race tracks, insulating layers build up slowly with target usage (i.e., oxide or nitride films for Al, Ta, and Ti targets). Eventually, the charge accumulation on the dielectric layer leads to arcing and particle generation. The propensity of arcing increases with target usage because of the buildup of dielectric layer. In the past, there have been several attempts to minimize arcing effect by severe deformation and precipitate free targets thru solutionization, by introducing a beveled edge to minimize the redepostion from the line of sight, by modifying vent slot design, installing the plasma ignition site at selective locations (as disclosed in U.S. Ser. No. 11/150,922 filed on Jun.

13, 2005, which is incorporated herein in its entirety). In the past also, an attempt was made to increase a target life by increasing the thickness of a target on eroding tracks. However, such design produced uneven plasma distribution and frequent T/S spacing requirement for the optimization of film uniformity (Praxair MRC's RE-Al target). Other life extension method used grooved backing plate to minimized the effect of eddy current (as disclosed in U.S. Ser. No. 11/656,705 filed on Jan. 22, 2007, which is incorporated herein in its entirety).

Although the impact of strike-arc-induced particles has not been well recognized in industrial community, experimental evidences indicate that a major cause of target and system contamination is the strike-arcs, which are essential for plasma ignition. Novel and effective designs should tailor the profile of electric field on the target surface via surface geometry control, such that the plasma is enhanced around the edge and non-eroding tracks, resulting in reduced dielectric buildup, reduced particle generation, increased target life, and improved film uniformity.

After reviewing the conventional target designs and the Infineon and AMAT modifications, it is clear that additional and more strategic modifications should be made to the targets to reduce particles. Modified targets a) should be designed based on the physics of electric potential field, so the design optimization is realized, and in some cases the magnetic field; b) should have a modified target sidewall that does not merely act as reflective plane for the strike-arc induced particles redirecting some of the particles toward the wafer; c) should have a target edge that has a cooling pattern similar to the center, so sputter atoms do not condense easily on the edge causing nodule formation; d) any modification should result in efficient strike-arc sites (i.e., less sharp, lower electric potential field); and e) the modification should result in a defined demarcation between the arcing and non-arcing area.

SUMMARY OF THE SUBJECT MATTER

Field-enhanced sputtering targets are disclosed that include: a core material; and a surface material, wherein at least one of the core material or the surface material has a field strength design profile and wherein the sputtering target comprises a substantially uniform erosion profile.

Target assembly systems are also disclosed that include a field-enhanced sputtering target; and an anodic shield.

Additionally, methods of producing a substantially uniform erosion on a sputtering target are described that include: providing an anodic shield; providing a cathodic field-enhanced target; and initiating a plasma ignition arc, whereby the arc is located at the point of least resistance between the anodic shield and the cathodic field-enhanced target.

BRIEF DESCRIPTION OF THE FIGURES

Prior Art

FIG. 10 shows an anticipated erosion profile 1020 of a field-enhanced titanium target 1000, where both the eroding and low-eroding peaks are kept to the same level of the original surface.

FIG. 11 shows a comparison of a conventional aluminum target 1100 with a field-enhanced aluminum target 1140 wherein the erosion profile 1110 of the conventional target 1100 is shown on the field enhanced target 1140 as compared with the field enhanced target surface 1130.

FIG. 16A shows the results of a plasma that is initiated via arcing that inevitably produces particles 1610 on a wafer 1600.

FIG. 16B shows how strike-arc induced particles 1610 near the wafer edge 1620 are arrested by incorporating a catch-ring system.

Figure 19:
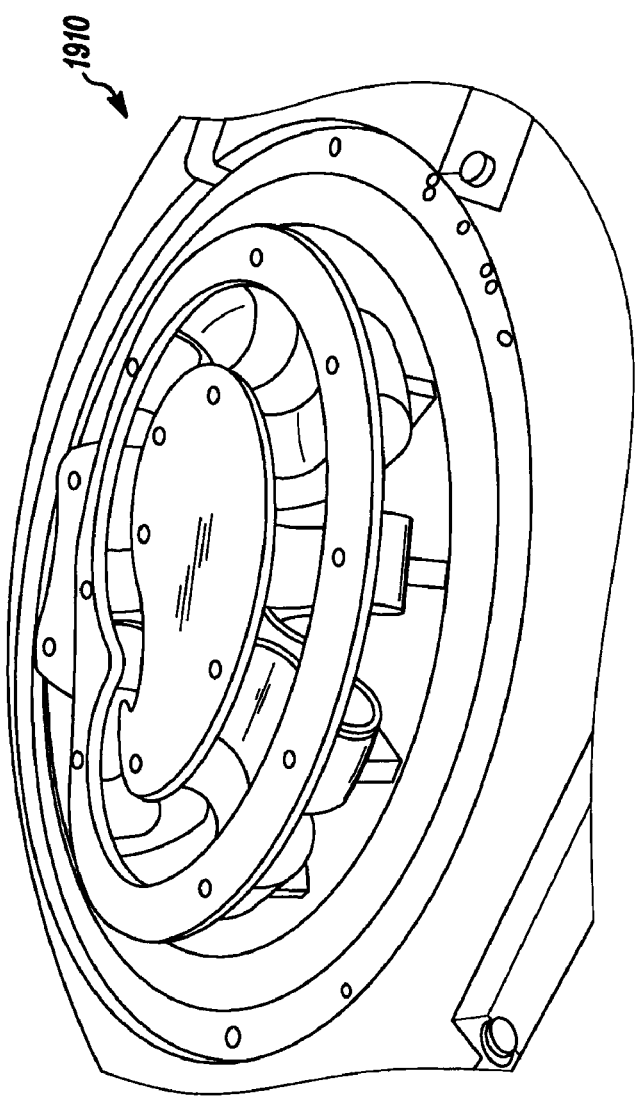

A standard magnet 1910, which is designed to optimize film uniformity, is shown in FIG. 19.

Figure 20:
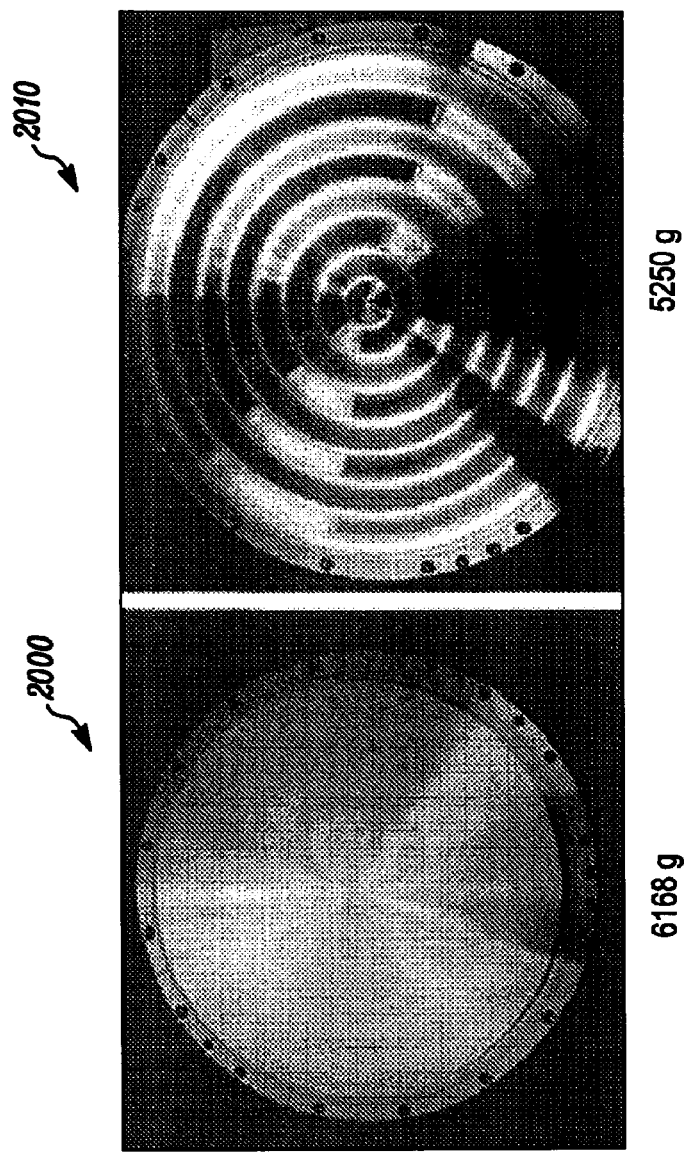

As a contrast, FIG. 20 shows a new conventional or standard target 2000 and the design of a new field-enhanced target 2010.

Figure 21:
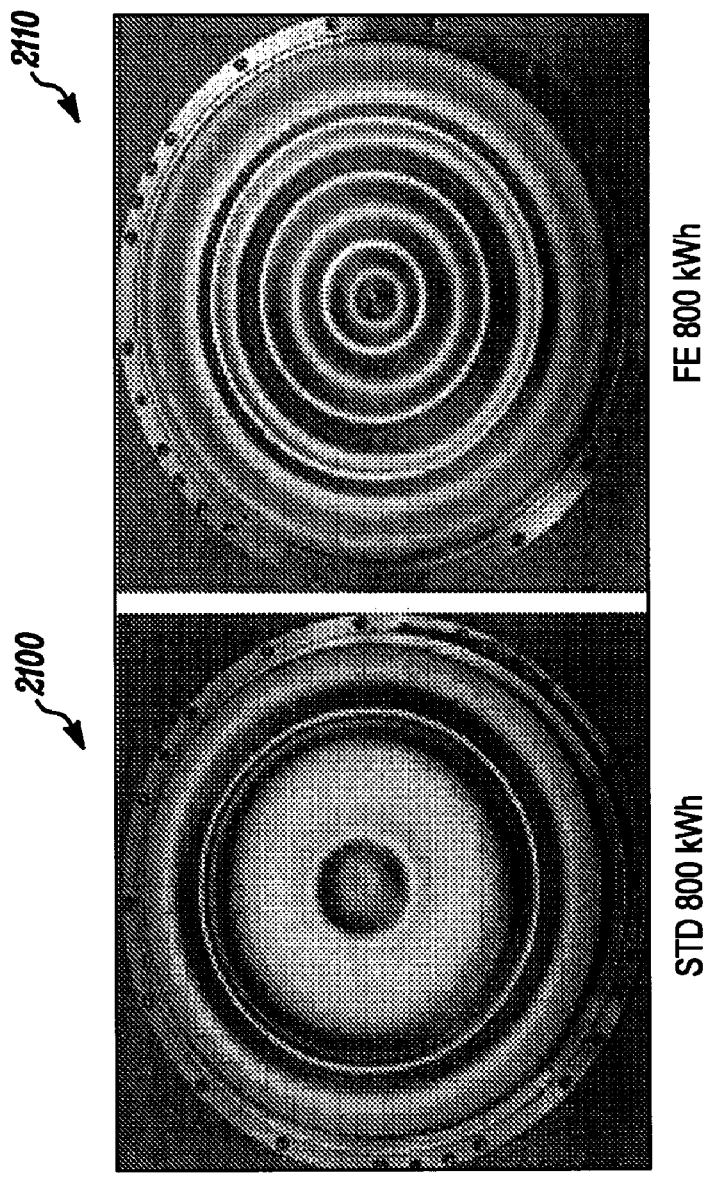

FIG. 21 shows the surface contours/erosion profiles of a conventional or standard target 2100 and a field-enhanced target after 800 kWh 2110.

Figure 22A:
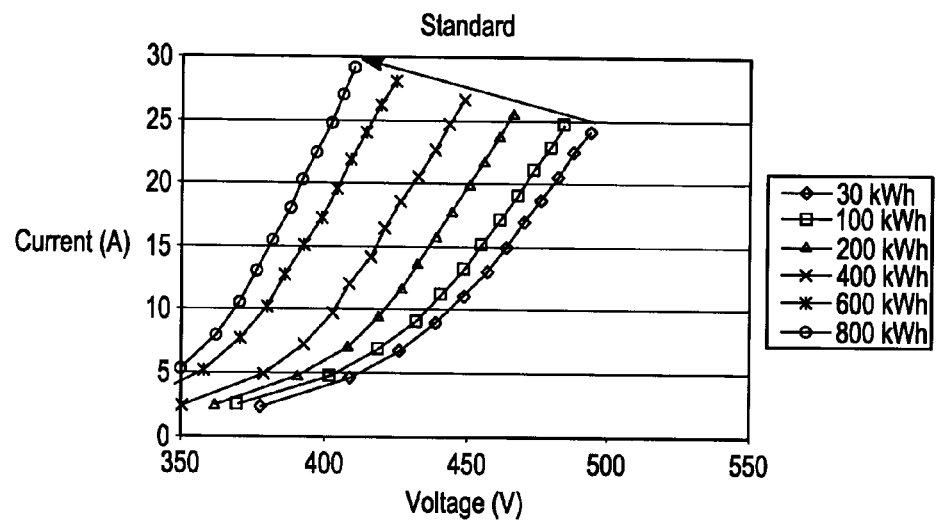
Figure 22B:
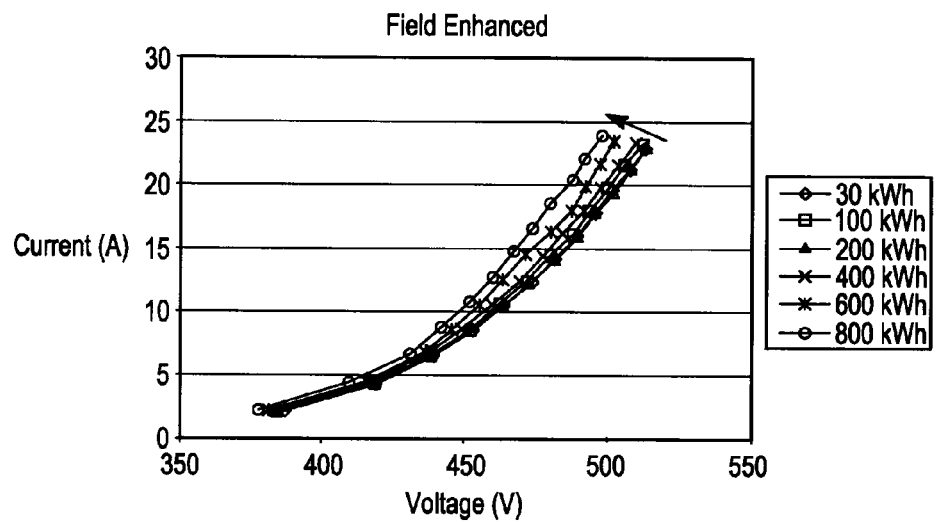

FIGS. 22A and 22B show I-V variation versus target life for a standard target and a field-enhanced target.

Figure 23A:
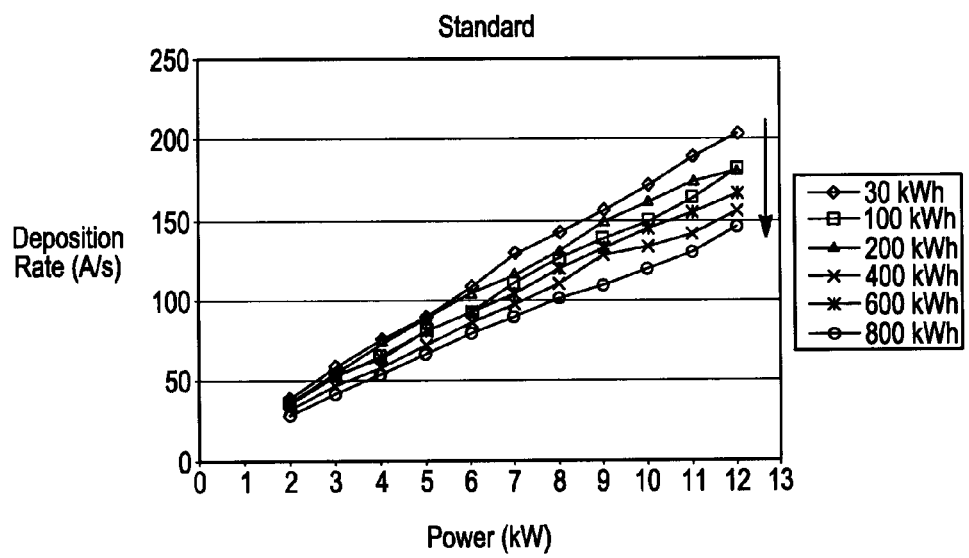
Figure 23B:
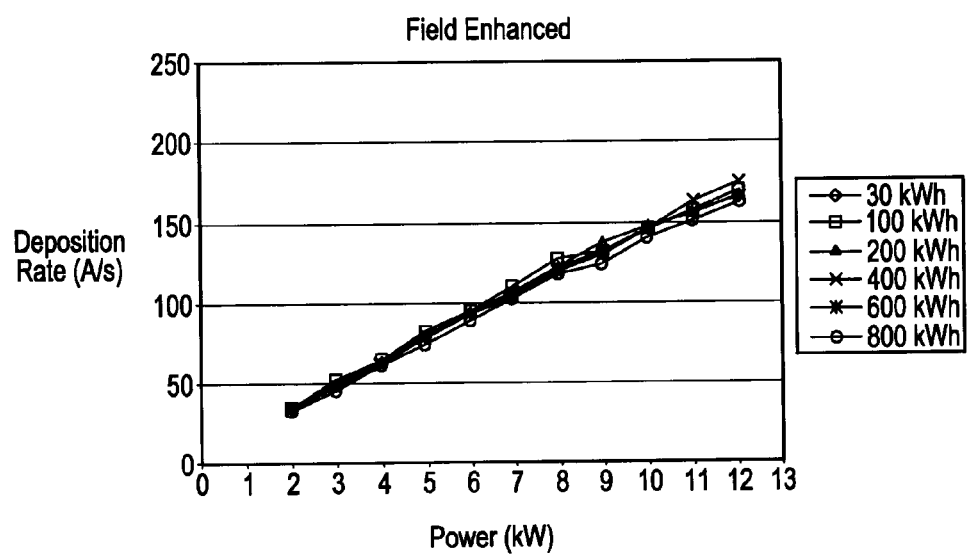

FIGS. 23A and 23B show deposition rate versus power at various target lives for a standard target and a field-enhanced target.

Figure 24A:
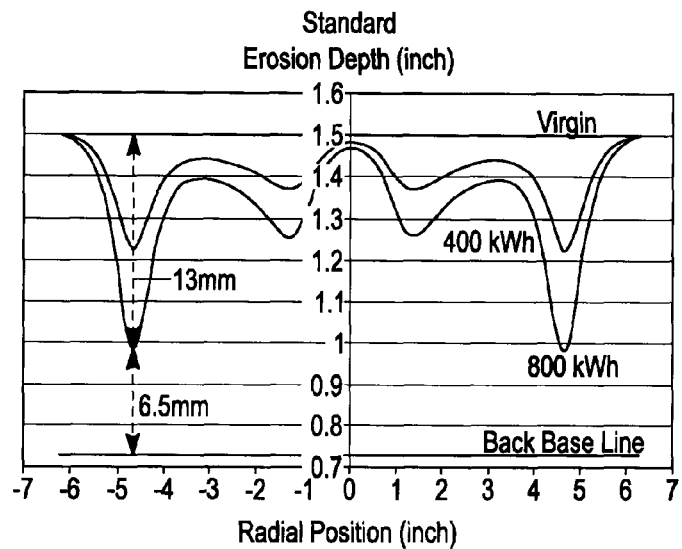
Figure 24B:
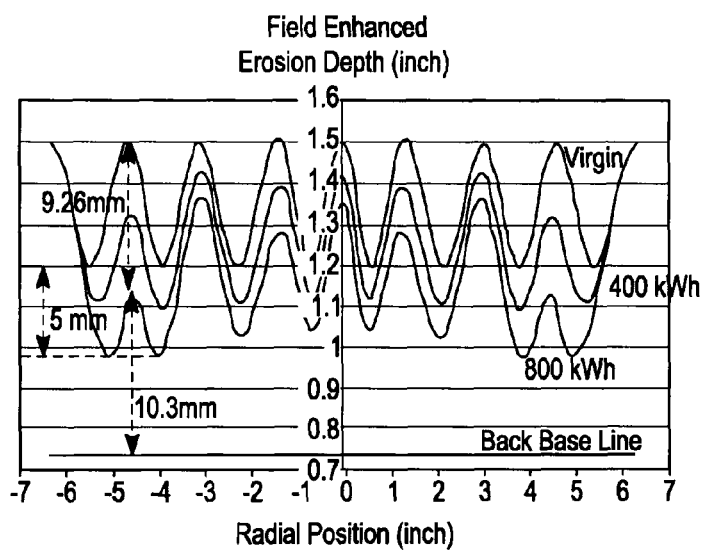

FIGS. 24A and 24B show the erosion profile versus life of both a standard target and a field-enhanced target at 800 kWh.

Figure 25:
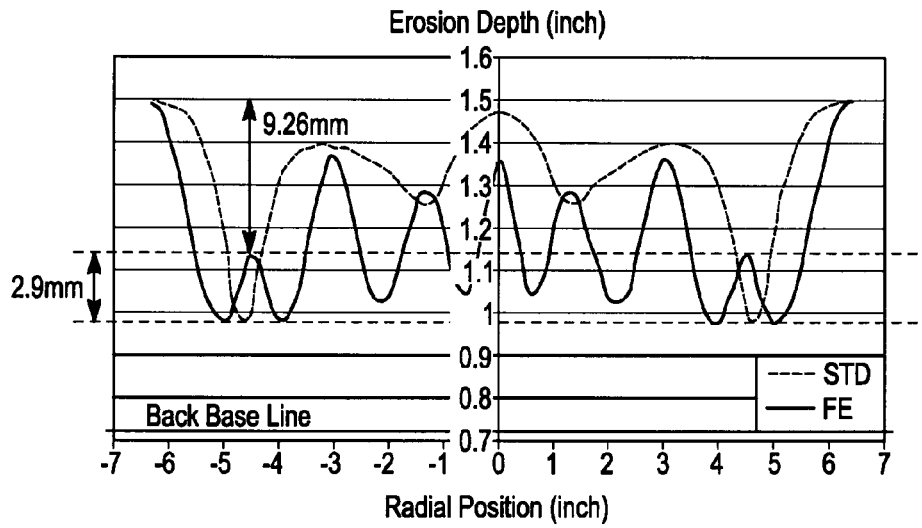

FIG. 25 shows a comparison of the erosion profile at 800 kWh of the standard and field-enhanced targets.

Figure 26:
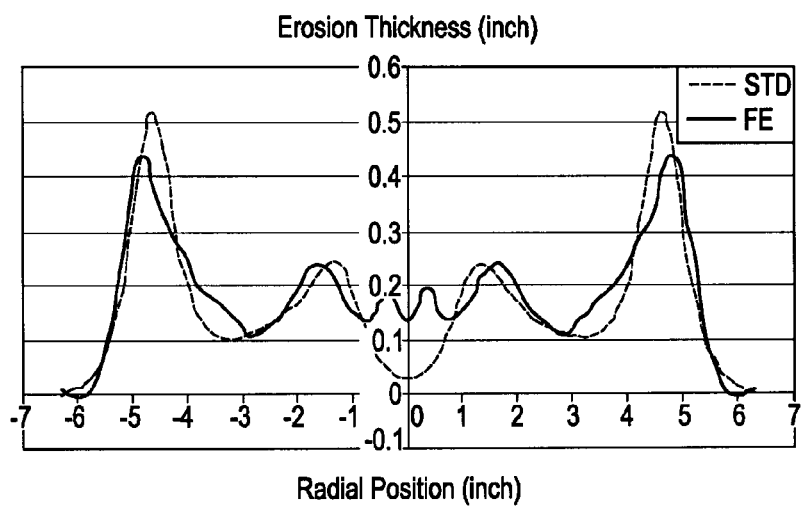

FIG. 26 shows a comparison of the erosion thickness at 800 kWh of the standard and field-enhanced targets.

Figure 27:
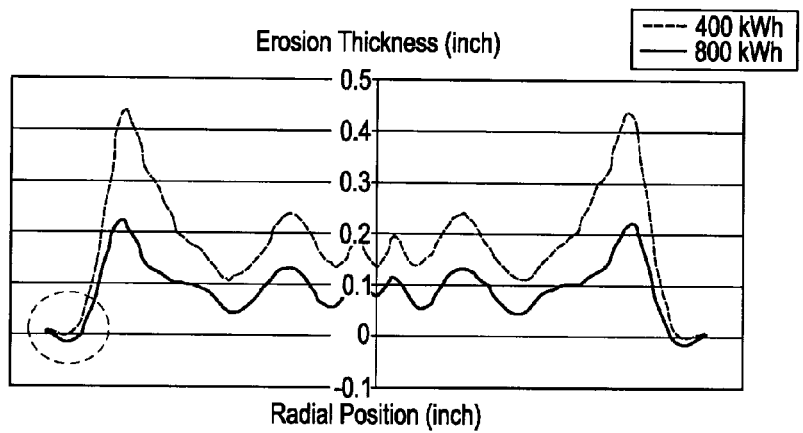

FIG. 27 shows the erosion thickness of a field-enhanced aluminum target at 400 kWh and 800 kWh.

Table 1 shows material distribution after 800 kWh.

DETAILED DESCRIPTION

Figure 1:
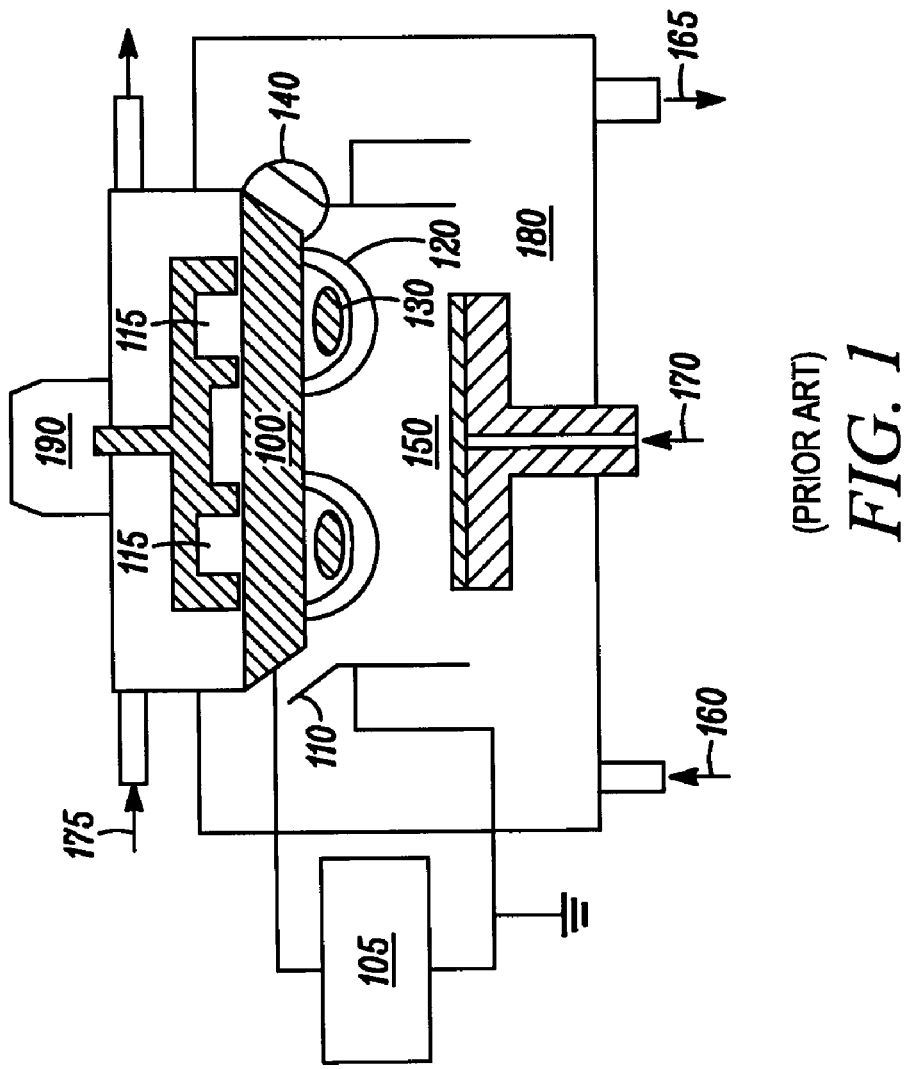
FIG. 1 shows a conventional cathode target 100/anodic shield 110 arrangement.

As mentioned earlier, in a DC magnetron sputtering system, deposition begins with plasma ignition that is triggered by electrical arcing between an anodic shield and a cathodic target. Prior Art FIG. 1 shows a conventional cathode target 100/anodic shield 110 arrangement. The target and anode are connected to a DC power supply 105. In this conventional arrangement comprising two magnetic poles 115, a dense plasma 130 is formed around a magnetic field or flux 120. The strike area 140 is also shown. Water 175 is directed into the system with the help of a rotary motor 190. In this embodiment, a silicon wafer 150 is placed in the chamber 180 on top of a heated gas line 170. Process gas 160 is added to the chamber and pumped out by pump 165.

Particles are always generated during arcing and become a major source of defects responsible for the reduced yield in microelectronic chip fabrication. The strike arc induced particles and/or plasma ignition particles are ejected at a high velocity, like shot gun pellets, guided by the gap between the shield and the target side wall. These particles not only land on the wafer surface, but their impact also causes severe plowing and chipping on the wafer, predominately on the outer edges of the wafer's top surface, producing additional particles, particularly silicon and oxygen containing particles. Some of the small airborne particles stick to the target and surrounding surfaces becoming additional arc sites, further negatively impacting yield management. In addition, conventional target surfaces regularly erode in a non-uniform manner during use, which can lead to inferior deposition layers.

Prior research has focused on minimizing arcing effects by modifying the vent slot design, and this approach has yielded some success in mitigating the gas turbulence effect that triggers more violent arcing, along with providing for a uniform erosion of the target face, longer target life and more uniform deposition. In order to manage these defects, a deposition apparatus and sputtering chamber system has been developed that maximizes uniformity of the coating, film or deposition on a surface and/or substrate. More specifically, an apparatus and related method has surprisingly been developed that will address the gas turbulence effect in more detail. Modified targets described herein a) are designed based on the physics of electric potential field, so the design optimization is realized, and in some cases take into effect the magnetic field effect; b) have a modified target sidewall that does not merely act as reflective plane for the strike-arc induced particles redirecting some of the particles toward the wafer; c) have a target edge that has a cooling pattern similar to the center, so sputter atoms do not condense easily on the edge causing nodule formation; d) result in efficient strike-arc sites (i.e., less sharp, lower electric potential field); and e) result in a defined demarcation between the arcing and non-arcing area.

In a conventional target, the erosion profile of a target is mainly determined by the magnet configuration in a DC magnetron sputtering system. The magnets also affect the I-V characteristics, deposition rate, film uniformity, and target life. In a contemplated "field-enhanced" target, the electric field on the target surface, and in some embodiments the magnetic field, is used as an additional control parameter to improve target performance. For a target manufacturer, this parameter is a very powerful tool in controlling the target performance. The results show that the erosion profile of a target and the film uniformity can be controlled in a desired way by tailoring the surface contour or electric field of a target.

Field-enhanced sputtering targets are disclosed that include: a core material; and a surface material, wherein at least one of the core material or the surface material has a field strength design profile and wherein the sputtering target comprises a substantially uniform erosion profile. Target assembly systems are also disclosed that include a field-enhanced sputtering target; and an anodic shield. Additionally, methods of producing a substantially uniform erosion on a sputtering target are described that include: providing an anodic shield; providing a cathodic field-enhanced target; and initiating a plasma ignition arc, whereby the arc is located at the point of least resistance between the anodic shield and the cathodic field-enhanced target. As used herein, the phrase "field strength design profile" means strategic target modifications designed to take into account the field strength effects during use, such as the electric field strength effects, the magnetic field strength effects for a combination thereof. As used herein, a "uniform erosion profile" means that contemplated sputtering targets erode during use in a uniform manner based on the strategic target modifications mentioned herein.

Figure 2:
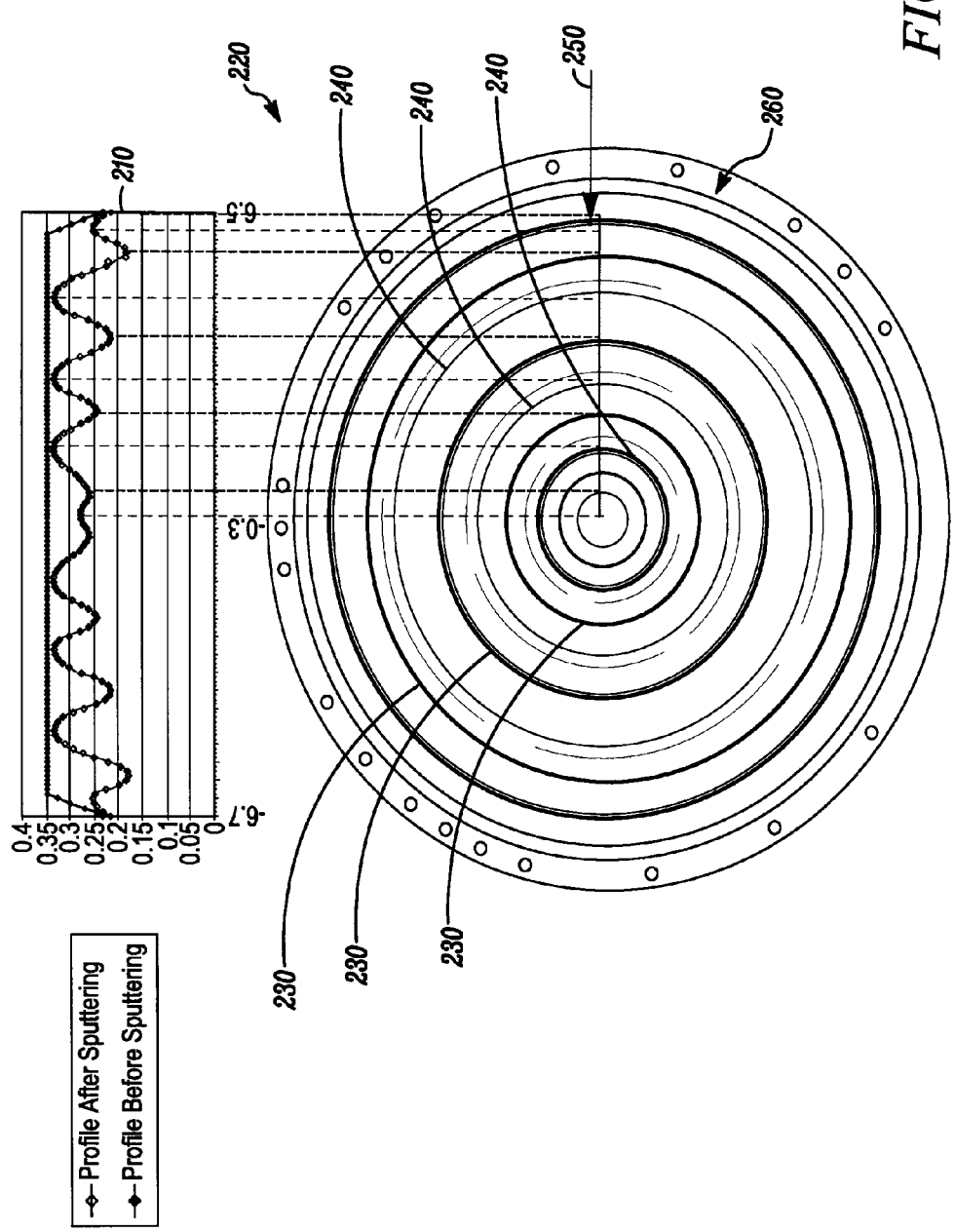
In FIG. 2, an erosion profile 210 is shown, along with an actual eroded conventional target 220.

The target designs disclosed herein enhance the electric field strength of the poorly eroding race tracks on a target surface, such as those shown in FIG. 2, by tailoring the surface geometry, such that it enhances sputtering efficiency around the edge and on the poorly eroding race tracks, prevents a buildup of insulating layer (which are tantamount to large dielectric particles) and nodules formation, extends the target life, and improves the film uniformity. In FIG. 2, an erosion profile 210 is shown, along with an actual eroded conventional target 220. On this target 220, there are eroding tracks 230, non-eroding or poorly eroding tracks 240 and a nodule and insulating layer 250 that forms on the non-eroding edge track 260. So, for example, during a TTN process, poorly conducting nitride films build up along the poorly eroding "race tracks" or "tracks", on which charges accumulate resulting in increased field strength and arcing, particularly at a later stage in target life.

Figure 3:
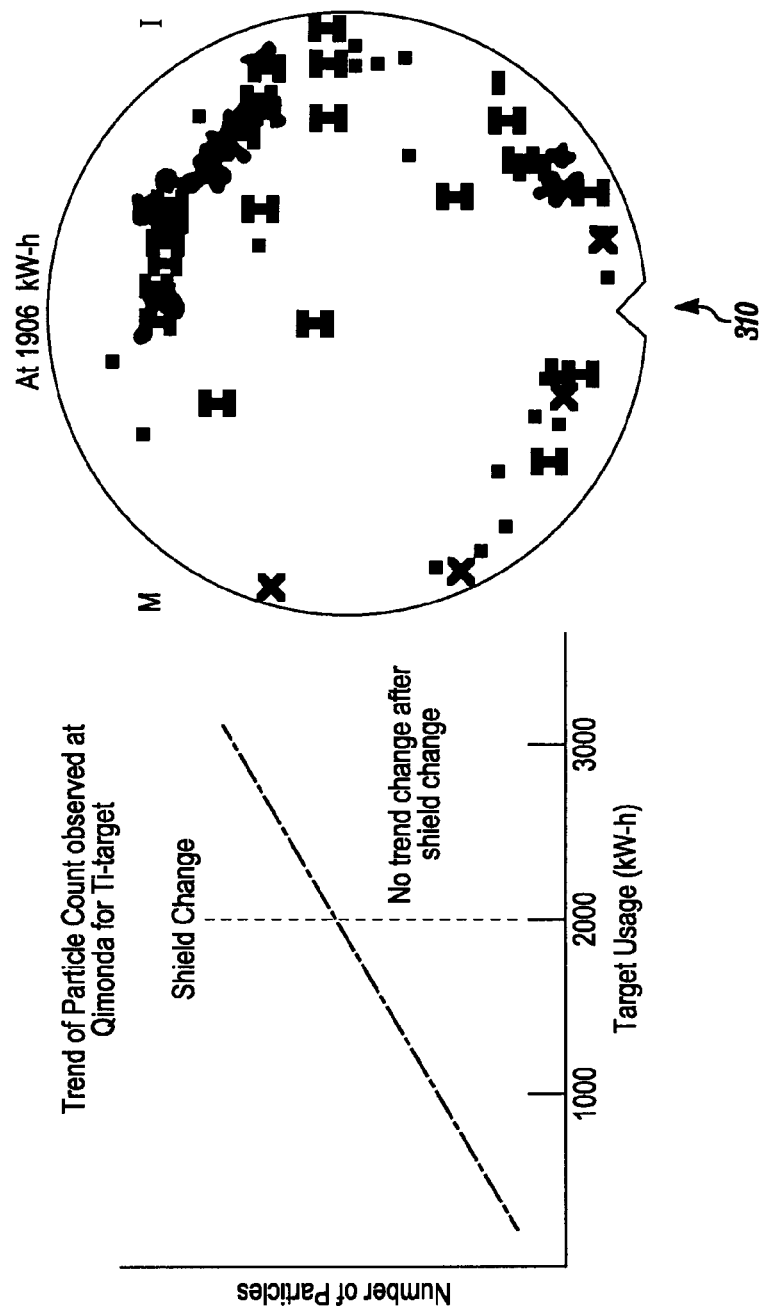
FIG. 3 shows the effect of an insulating layer buildup on non-eroding "race tracks".
Figure 4:
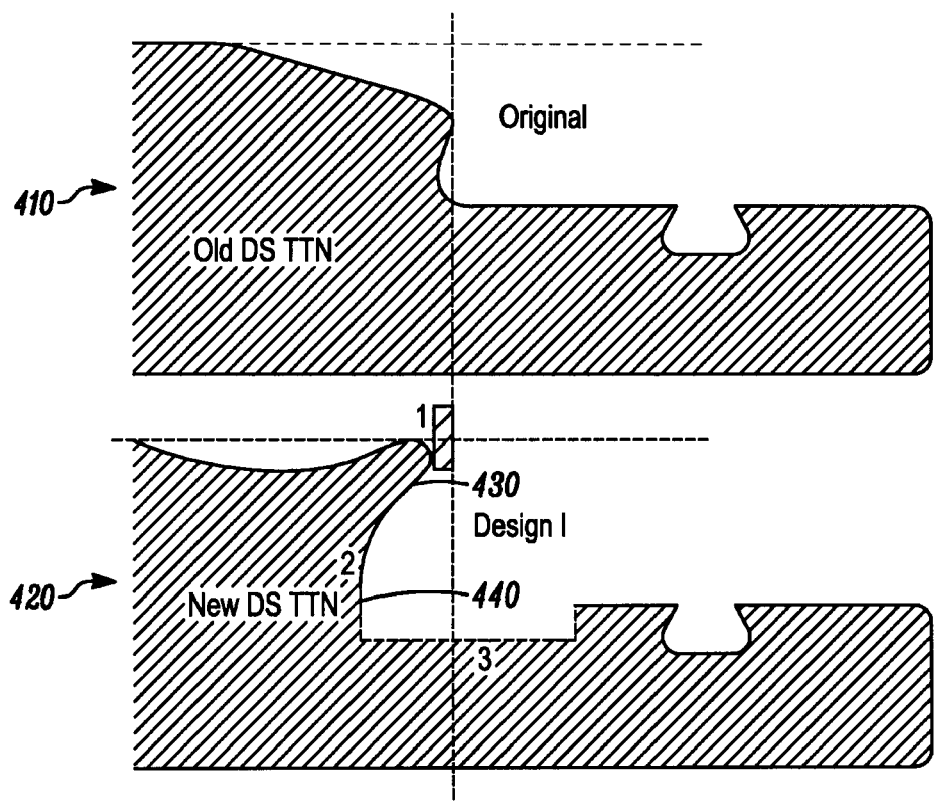
FIG. 4 shows a conventional target design as compared to a contemplated target design.
Figure 5:
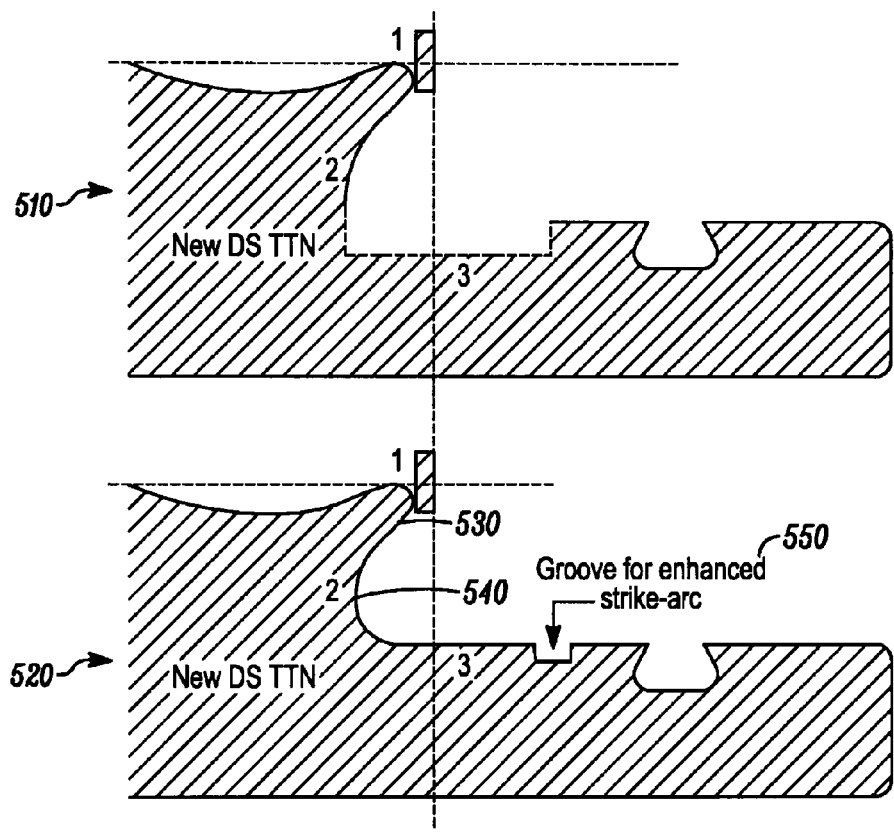
FIG. 5 shows a conventional target design as compared to a contemplated target design.
Figure 6:
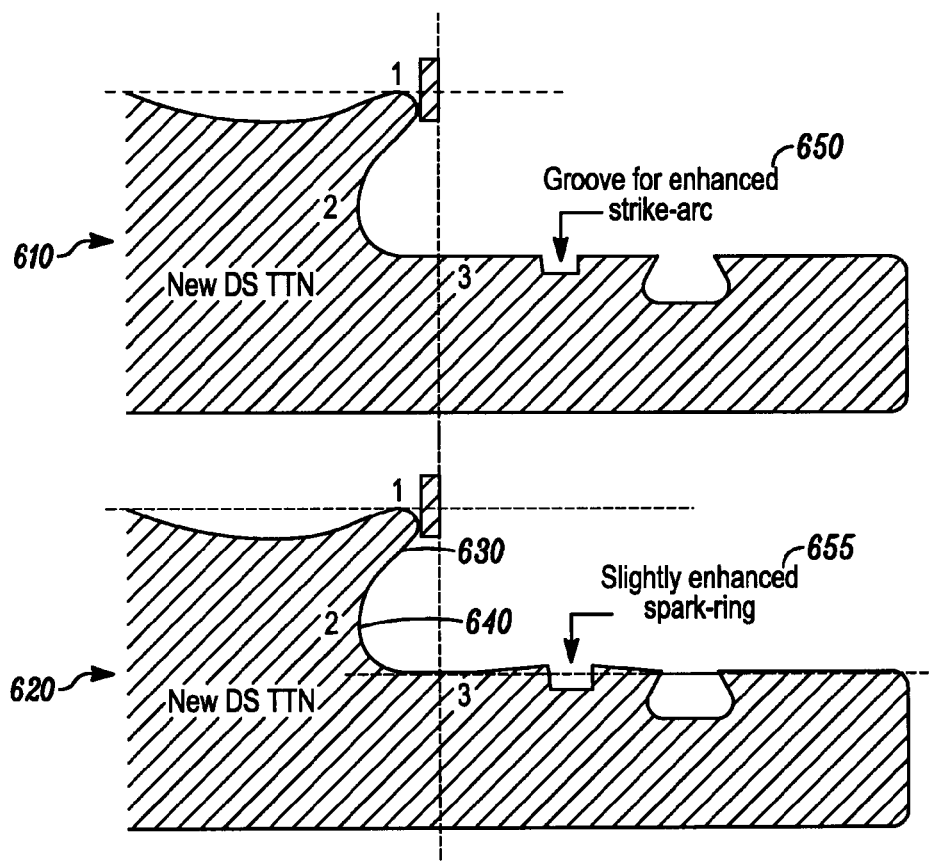
FIG. 6 shows a conventional target design as compared to a contemplated target design.
Figure 7:
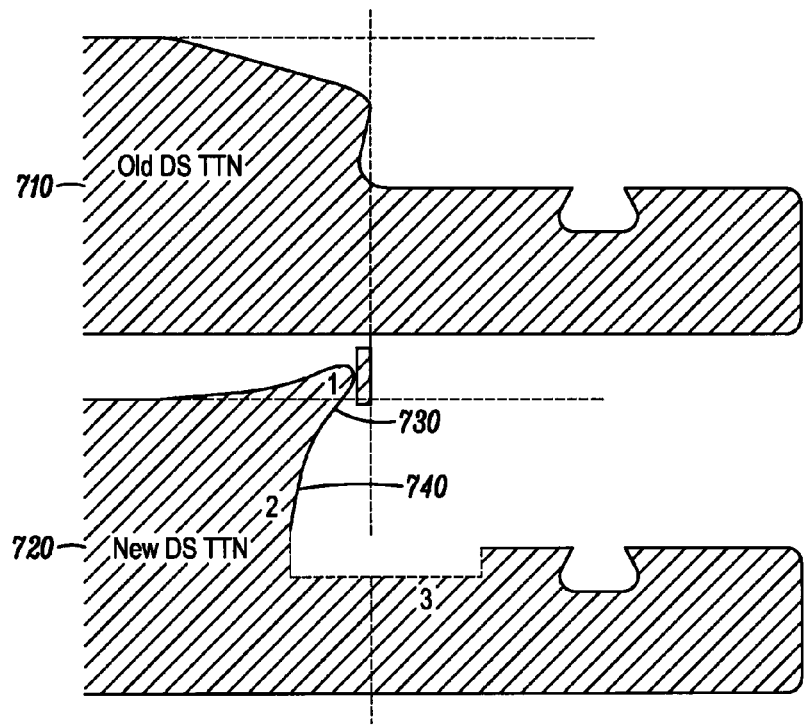
FIG. 7 shows a conventional target design as compared to a contemplated target design.

FIG. 3 shows the effect of an insulating layer buildup on non-eroding "race tracks". The particle count was found to increase linearly with target usage. In addition, after the shield change, the particle count increased continuously, suggesting that the origin of the particles was the target—not the shield. As shown in the accompanying map 310, particles were found to be circularly distributed around the edge of the wafers, suggesting that the build up of the insulating layer on the non-eroding race track and possibly the condensation around the target sidewall are likely the cause of the particles.

Contemplated design modifications are based on the principle that the electric field strength is stronger on the area with a curvature and/or sharp curvature than the surrounding flat area and that the plasma attraction increases with increasing electric field strength. The most significant problem areas are the edge and non-eroding race tracks of a target where the plasma density and the erosion rate are low. In the new design, the target edge and the poorly eroding race tracks are made to have a more pronounced or sharper curvature than the neighboring area, such that the electric field strength and plasma density are enhanced on such areas, resulting in reduced particle generation, extended target life, and improved film uniformity.

FIGS. 4-7 show several contemplated designs where the original target (410, 510, 610 and 710, respectively) design has been modified according to the stated principles to produce a modified target (420, 520, 620, 720, respectively). Some contemplated benefits of the novel designs include: a) sharper (but tapered), recessed (1~2 mm), and raised tip (430, 530, 630 and 730, respectively), including a sharper, more pronounced tip, whereby a higher electric field attracts more plasma (more sputtering) and thus prevents nodule condensation, a recessed position—wider spacing from the shield prevents strike-arc here; b) a recessed sidewall groove (440, 540, 640 and 740, respectively), as much as allowed, wherein a recessed groove slows cooling (less condensation), traps arc-induced particles, and holds condensation nodules (possibly with nitride B-blast), and a recessed groove prevents arcing here and thus reduces the knock-off probability for condensed particles; and c) a grooved backing plate or "BP" flange (550, 650 and 655, respectively), wherein a recessed flange surface forces strike-arc to occur in non-line-of sight region, which is similar to the strike-ring target concept. The design is based on the concept that the electric field strength is greater on a geometrical protrusion than on the neighboring flat area.

In contemplated embodiments, the field strength design profile, which incorporates the benefits described above, comprises at least one curvature feature. In some embodiments, contemplated targets comprise at least one curvature feature on the target edge. As mentioned throughout this document, conventional targets comprise at least one high erosion area that presents itself during use. In contemplated embodiments, at least one curvature feature is applied to the at least one high erosion area prior to the initial use of the sputtering target. In some contemplated embodiments, the at least one curvature feature comprises strategic target surface modification based on a contemplated and known erosion profile that develops during use. In some contemplated embodiments, modified targets will comprise less core and surface material than standard or conventional targets. In some contemplated embodiments, modified targets comprise at least about 5% less core and surface material than standard or conventional targets. In other contemplated embodiments, modified targets comprise at least about 10% less core and surface material than standard or conventional targets. In yet other contemplated embodiments, modified targets comprise at least about 15% less core and surface material than standard or conventional targets.

Figure 8:
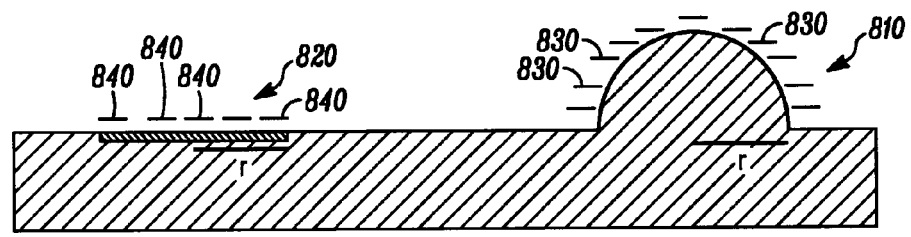
FIG. 8 shows the electric field concept for both a hemisphere and a circle.

To understand the theory behind these contemplated design modifications and their success one should review the calculation of the electric field for both a hemisphere and a circle. The electric charge 830 of a hemisphere 810 is twice that of the electric charge 840 of the flat surface 820 ((electric field (hemisphere)/electric field (circle))=$((½(4\pi r^2))/\pi r^2)$ =2), wherein "r" is the radius. So, if the electric potential of the flat surface is 400V, then the potential of the hemisphere would be about 800V. Graphically, this concept is shown in FIG. 8.

Figure 9:
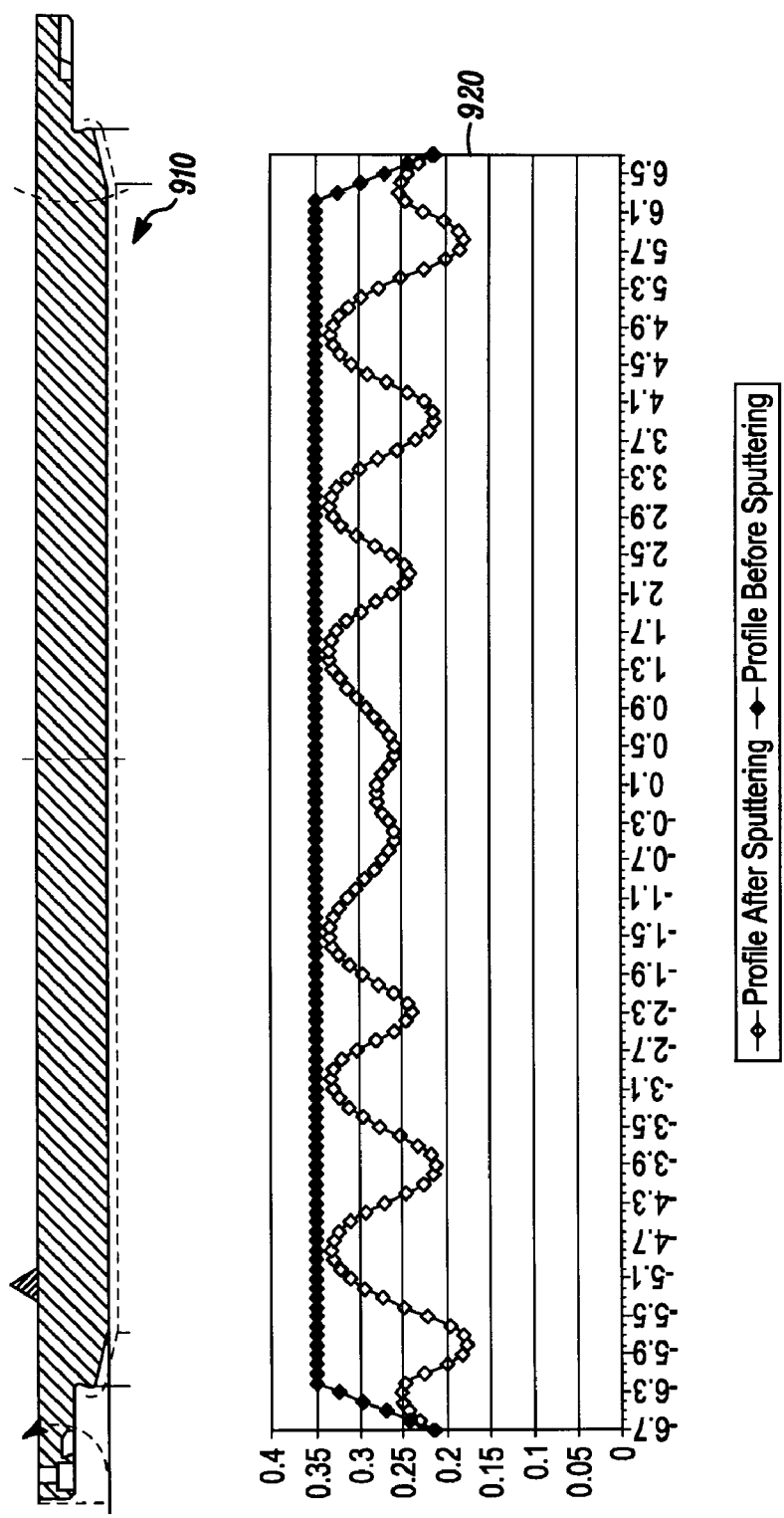
FIG. 9 shows an erosion profile 920 of a typical target 910.

FIG. 9 shows an erosion profile 920 of a typical target 910. FIG. 10 shows an anticipated erosion profile 1020 of a field-enhanced titanium target 1000, where both the eroding and low-eroding peaks are kept to the same level of the original surface. The eroding peaks are maintained to the original surface level 1010 to keep the maximum material available to be sputtered, as shown by the field-enhanced target surface 1030. The low-eroding peaks are also placed to the same level of the original surface to increase the electric field, thereby enhancing plasma attraction and sputtering.

FIG. 11 shows a comparison of a conventional aluminum target 1100 with a field-enhanced aluminum target 1140 wherein the erosion profile 1110 of the conventional target 1100 is shown on the field enhanced target 1140 as compared with the field enhanced target surface 1130. The peak surface height is kept at the same level as the original target surface 1120 or can be enhanced if extended target life is desired.

Figure 12:
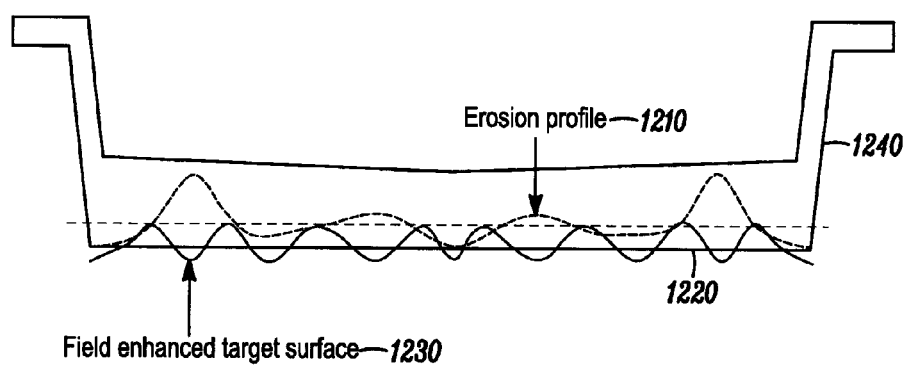
FIG. 12 shows another field enhanced surface design 1230 of the same target 1240, where the erosion profile 1210 is shown for reference.
Figure 13:
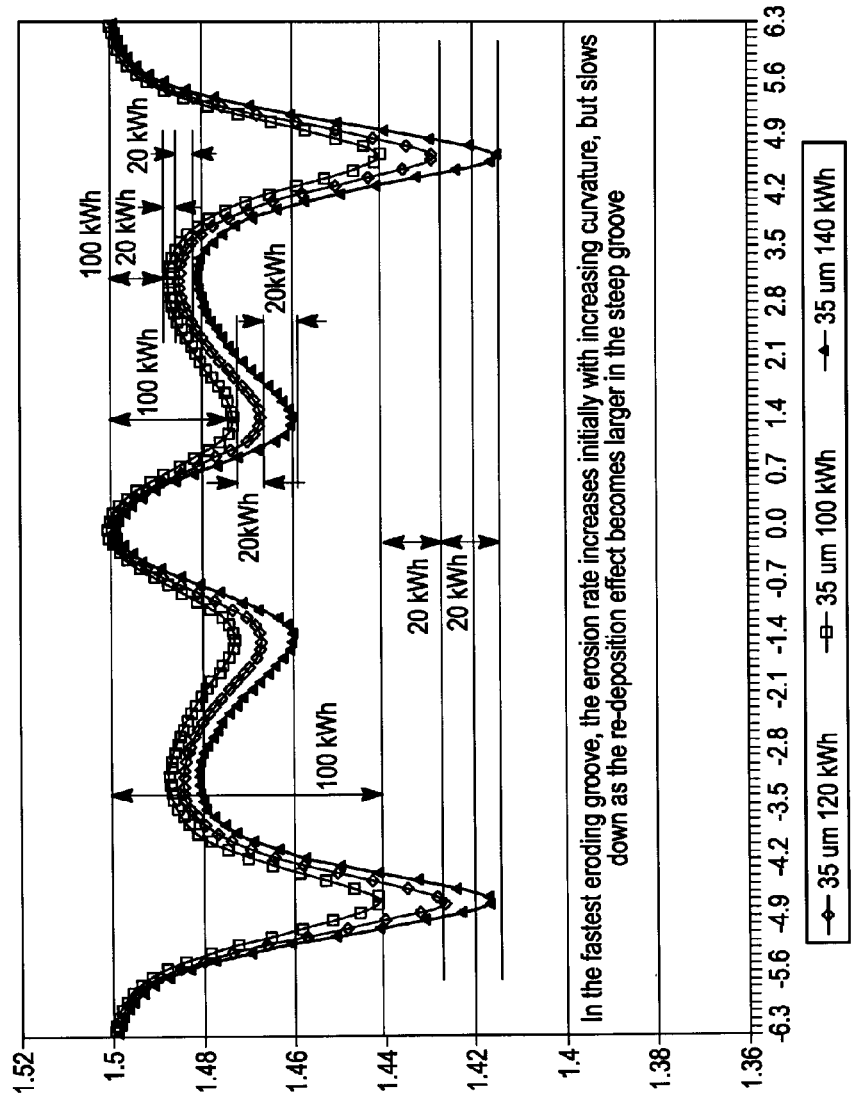
FIG. 13 shows erosion profiles versus target life for 35 μm grain aluminum target.

FIG. 12 shows another field enhanced surface design 1230 of the same target 1240, where the erosion profile 1210 and original target surface 1220 are shown for reference. FIG. 13 shows erosion profiles versus target life for 35 μm grain aluminum target. In the fastest eroding groove, the erosion rate increases initially with increasing curvature, but slows down as the re-deposition effect becomes larger in the steep groove. The enhancement of erosion rate is apparent with increasing curvature (target lift) for both the hills and the valleys. In contemplated designs, the electric field on the target surface is used as an additional control parameter to improve plasma distribution and erosion profile. In the "Field Enhanced" target, the first peaks are made at fast and poorly eroding areas, to have more materials on the fast eroding areas and to enhance electric field on the poorly eroding areas.

Figure 14:
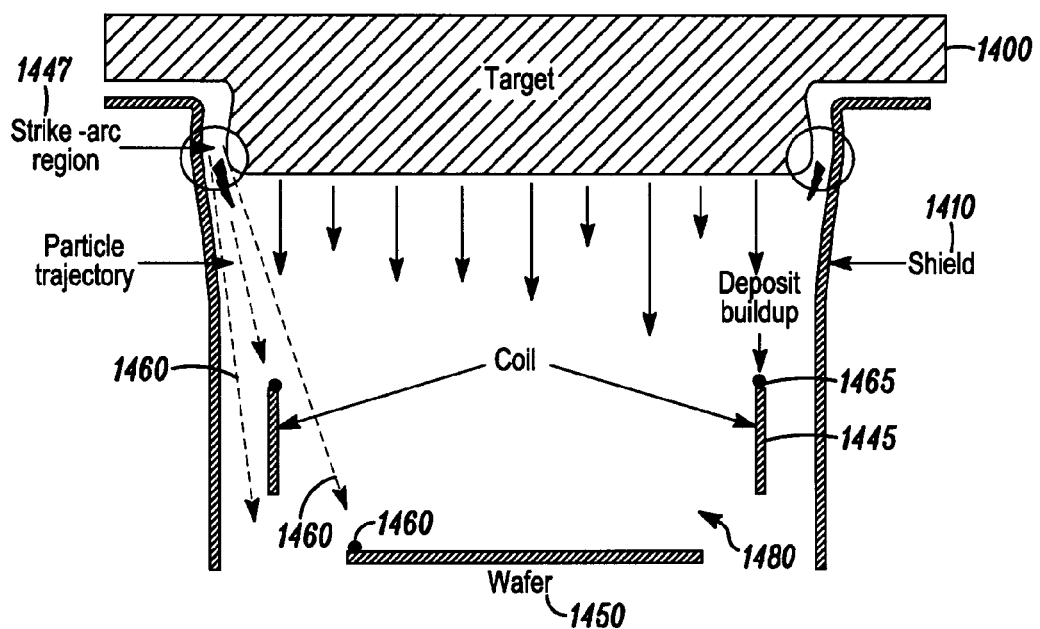
FIG. 14 shows the conventional system from Prior Art FIG. 1 where a particle catch-ring is coupled to and located around the anodic shield.
Figure 15A:
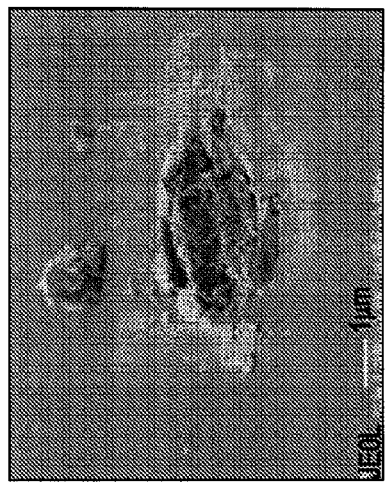
FIGS. 15A-15D show the impact of strike-arc-induces particles with a TiN target.
Figure 15B:
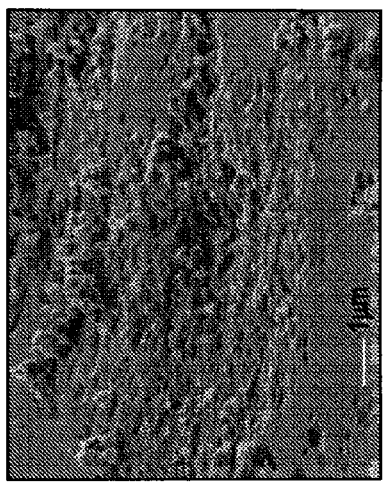
Figure 15C:
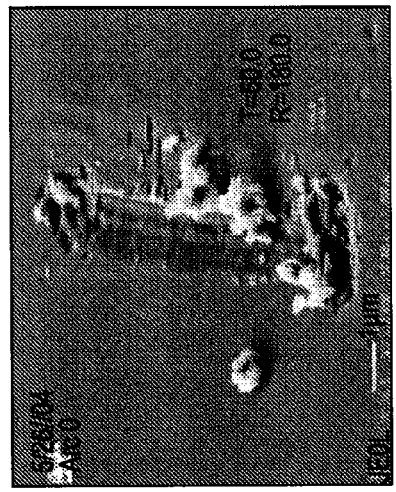
Figure 15D:
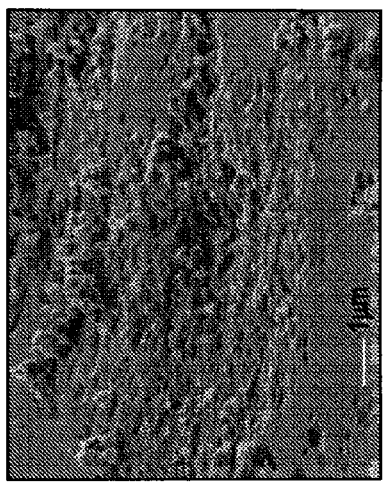

Strike-arc is an essential step for plasma ignition, but unfortunately it always produces large particles, which can land on the top of a coil and around the edge of a wafer and can become arcing and nucleation sites. In one contemplated embodiment, a catch-ring is installed in the particle projectile path that will intercept with the particles that are ejected from the arc start. In this embodiment, a DC magnetron sputtering system comprises an anodic shield; a cathodic target that comprises at least one sidewall; a plasma ignition arc; and a catch-ring coupled to and located around the shield. FIG. 14 shows the conventional system from Prior Art FIG. 1 where a particle catch-ring is coupled to and located around the anodic shield. The modified system in FIG. 14 shows a cathode target 1400/anodic shield 1410 arrangement. The target and anode are connected to a DC power supply (not shown). In this modified arrangement, a catch ring or coil 1445 and a strike arc region 1447 is coupled to and located around the anode 1410 in order to help control errant particles 1460 and additional deposit buildup 1465. As in the conventional system, water is directed into the system with the help of a rotary motor. In this embodiment, a silicon wafer 1450 is placed in the chamber 1480 on top of a heated gas line (not shown). Process gas is added to the chamber and pumped out by pump.

FIGS. 15A-15D show the impact of strike-arc-induces particles with a TiN target. SEM images show that strike-arc-induced defects are quite massive and violent, and cause severe damages on the wafer. Although most defects were confined within a few mm of the wafer edge, the high speed impact often produces long flight trajectory particles contaminating the target.

FIG. 16A shows the results of a plasma that is initiated via arcing that inevitably produces particles 1610 on a wafer 1600. The strike-arc induced particles 1610 are mostly confined within a few mm of the wafer perimeter 1620 because the particle ejection projectile is guided by the approximately 1 mm gap between the anodic shield and the cathodic target-sidewall. These particles 1610 become subsequent arcing sites that contaminate the target and cause defects in the wafers. In recognition of this known particle ejection projectile path, particles can be arrested before reaching the wafer by placing a catch-ring around the shield in the particle projectile path. A particle catch-ring is coupled to and is placed around the anodic shield below the target. The position and placement of the ring is determined by the need to block the ejected particles but not to interfere the sputtered atoms. The width of a catch-ring is designed to allow about 1-3 mm overlap with the projection of the target's edge. The width of the ring can be increased as the ring is lowered away from the target. Typical ring width can be about 1 cm at about 2 cm below the target. Such an arrangement also extends the anodic field, so the plasma density near the edge of the target can be increased, resulting in reduced nodule formation around the edge of the target, particularly in nitriding process such as TaN and TiN. FIG. 16B shows how strike-arc induced particles 1610 near the wafer edge 1620 are arrested by incorporating a catch-ring system. The particles shown on the wafer 1600 in this figure are mostly from a flaking shield that had reached a maintenance cycle. If the chamber had been clean, there would have been much fewer particles.

In another embodiment, the initial arc is located so as to direct the particles to areas that will minimize their damage to the microelectronic devices on the wafer. These embodiments are similar to those found in U.S. patent application Ser. No. 11/150,900 filed on Jun. 13, 2005, which is commonly-owned by Honeywell International Inc. and incorporated herein in its entirety by reference, where a DC magnetron sputtering system comprises an anodic shield; a cathodic target comprising at least one recess, cavity or a combination thereof and at least one protrusion; and a plasma ignition arc, whereby the arc is located at the point of least resistance between the anodic shield and the at least one recess, cavity or a combination thereof, the at least one protrusion or a combination thereof. The relocation of the arcing sites keeps the arc induced particle projectiles from reaching the surface of a wafer or the target surface in the sputtering system. Trench recesses can be modified and deepened such that strike-arc induced particle projectiles are not in line-of-sight with the wafer.

In these embodiments where the cathodic target comprises at least one recess, cavity or combination thereof and at least one protrusion, arc induced particle projectiles are directed away from the wafer surface by locating the initial arc site inside the recess or cavity or by locating the initial arc site where the protrusion has been formed. In some embodiments, protrusions may also be located or formed on the anodic shield in order to correspond with a protrusion or formation on or in the cathodic target having a vent slot. In these DC magnetron sputtering systems, the system comprises an anodic shield comprising at least one protrusion; a cathodic target comprising at least one recess, cavity or a combination thereof; and a plasma ignition arc, whereby the arc is located at the point of least resistance between the at least one protrusion coupled to the anodic shield and the at least one protrusion, recess or cavity. Experiments have shown that the plasma ignition arc will occur at the point of least resistance, typically the closest distance between the cathode (target) and anode (chamber shield) surfaces. This concept is similar to a spark plug in that it uses a electrical protrusion, or pin, as a point of highest electric potential field to start the plasma arc in a specific location. By locating the arc in a recess, cavity or combination thereof, the ejected projectiles can be directed away from the wafer surface. In some cases, such as a standard aluminum target, a simple pin can be located high on the side of the target sidewall such that projectiles are directed through a very narrow path that reduces the line of sight to the wafer.

Alternatively, a recess can be made in the target and corresponding pins (protrusions) can be located on the target and shield, again to decrease projectile line of sight travel to the wafer. An ignition enclosure can be made, that uses target supply voltages in an enclosure which shields particles, and the ignition enclosure can be placed in the chamber. Another method is to use the target supply (or external voltage) to ignite an arc in a recess built into the target that will direct arc projectiles in a desired path away from the wafer or target surface.

In the contemplated embodiments described herein, the arc induced particle projectiles can be significantly reduced when compared to a conventional system, wherein the cathodic target and/or the anodic shield are not modified by including a catch ring system or a protrusion, recess, cavity or combination thereof. The conventional system, such as that shown in Prior Art FIG. 1, can be considered the "reference" or "control" meaning that the number of arc-induced particle projectiles produced in conventional systems should be the zero point by which all other modified systems are measured. In systems contemplated and described herein, the number of arc-induced particle projectiles are reduced by at least about 10%. In some systems, the number of arc-induced particle projectiles are reduced by at least about 25%. In other contemplated and described systems, the number of arc-induced particle projectiles are reduced by at least about 50%.

Figure 17:
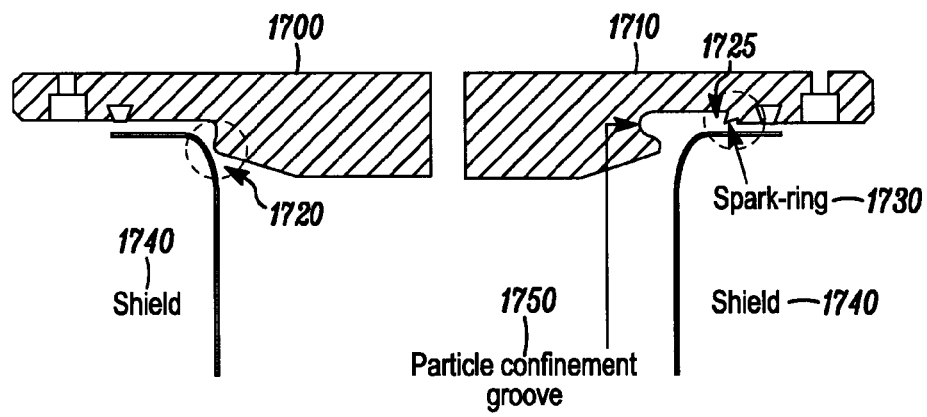
FIG. 17 shows a spark-ring target design 1710 concept for particle reduction—showing both the conventional design 1700 and a contemplated design 1710.

FIG. 17 shows a spark-ring target design 1710 concept for particle reduction—showing both the conventional design 1700 and the new design 1710. The design concept is based on the physics of arcing, in which the contemplated arcing sites 1720 and 1725, respectively, are narrow gaps and the sites with sharp asperities. In the new design, a spark-ring 1730 is placed away from the target sidewall and the arc-induced particles are arrested in the grooved sidewall 1750 and on top of the shield 1740.

Methods are also provided whereby the gas turbulence effect is mitigated, such methods include providing an anodic shield; providing a cathodic target comprising at least one recess, cavity or a combination thereof and at least one protrusion; and initiating a plasma ignition arc, whereby the arc is located at the point of least resistance between the anodic shield and the at least one recess, cavity or a combination thereof, the at least one protrusion or a combination thereof. Additional methods include providing an anodic shield; providing a cathodic target that comprises at least one sidewall; providing a catch-ring coupled to and around the shield; and initiating a plasma ignition arc. Methods are also provided whereby the gas turbulence effect is mitigated, such methods include providing an anodic shield comprising at least one protrusion; providing a cathodic target comprising at least one recess, cavity or a combination thereof; and initiating a plasma ignition arc, whereby the arc is located at the point of least resistance between the at least one protrusion coupled to the anodic shield and the at least one protrusion, recess or cavity.

Other apparatus may be added to the DC magnetron sputtering systems described herein, such as coil sets. Contemplated coil sets may include those described in U.S. application Ser. No. 11/086,022 filed on Mar. 22, 2005, which is commonly-owned and incorporated herein in its entirety by reference.

Sputtering targets contemplated herein also comprise a surface material and a core material, wherein the surface material is coupled to the core material. The surface material is that portion of the target that is exposed to the energy source at any measurable point in time and is also that part of the overall target material that is intended to produce atoms that are desirable as a surface coating. As used herein, the term "coupled" means a physical attachment of two parts of matter or components (adhesive, attachment interfacing material) or a physical and/or chemical attraction between two parts of matter or components, including bond forces such as covalent and ionic bonding, and non-bond forces such as Van der Waals, electrostatic, coulombic, hydrogen bonding and/or magnetic attraction. The surface material and core material may generally comprise the same elemental makeup or chemical composition/component, or the elemental makeup and chemical composition of the surface material may be altered or modified to be different than that of the core material. In most embodiments, the surface material and the core material comprise the same elemental makeup and chemical composition. However, in embodiments where it may be important to detect when the target's useful life has ended or where it is important to deposit a mixed layer of materials, the surface material and the core material may be tailored to comprise a different elemental makeup or chemical composition.

The core material is designed to provide support for the surface material and to possibly provide additional atoms in a sputtering process or information as to when a target's useful life has ended. For example, in a situation where the core material comprises a material different from that of the original surface material, and a quality control device detects the presence of core material atoms in the space between the target and the wafer, the target may need to be removed and retooled or discarded altogether because the chemical integrity and elemental purity of the metal coating could be compromised by depositing undesirable materials on the existing surface/wafer layer. The core material is also that portion of a sputtering target that does not comprise macroscale modifications or microdimples, such as those disclosed in PCT Application Serial No.: PCT/US02/06146 and U.S. application Ser. No. 10/672,690, both of which are commonly-owned by Honeywell International Inc. and are incorporated herein in their entirety by reference. In other words, the core material is generally uniform in structure and shape.

The surface material is that portion of the target that is exposed to the energy source at any measurable point in time and is also that part of the overall target material that is intended to produce atoms and/or molecules that are desirable as a surface coating. Contemplated surface materials make up a portion of the core material, which is the material of the target.

Sputtering targets, catch-rings and/or other related particle generation apparatus may generally comprise any material that can be a) reliably formed into a sputtering target, catch-rings and/or other related particle generation apparatus; b) sputtered from the target (and sometimes the coil) when bombarded by an energy source; and c) suitable for forming a final or precursor layer on a wafer or surface. It should be understood that although the catch-ring comprises materials that are considered the same or similar to those materials being sputtered, the catch-ring may or may not sputter atoms. Coil sputtering depends primarily on the coil bias with respect to the plasma and the wafer. Materials that are contemplated to make suitable sputtering targets, catch-rings and/or other related particle generation apparatus are metals, metal alloys, conductive polymers, conductive composite materials, conductive monomers, dielectric materials, hardmask materials and any other suitable sputtering material. As used herein, the term "metal" means those elements that are in the d-block and f-block of the Periodic Chart of the Elements, along with those elements that have metal-like properties, such as silicon and germanium. As used herein, the phrase "d-block" means those elements that have electrons filling the 3d, 4d, 5d, and 6d orbitals surrounding the nucleus of the element. As used herein, the phrase "f-block" means those elements that have electrons filling the 4f and 5f orbitals surrounding the nucleus of the element, including the lanthanides and the actinides. Preferred metals include titanium, silicon, cobalt, copper, nickel, iron, zinc, vanadium, ruthenium, zirconium, aluminum and aluminum-based materials, tantalum, niobium, tin, chromium, platinum, palladium, gold, silver, tungsten, molybdenum, cerium, promethium, thorium or a combination thereof. More preferred metals include copper, aluminum, ruthenium, tungsten, titanium, cobalt, tantalum, magnesium, lithium, silicon, manganese, iron or a combination thereof. Most preferred metals include copper, aluminum and aluminum-based materials, tungsten, titanium, zirconium, cobalt, ruthenium, tantalum, niobium or a combination thereof. Examples of contemplated and preferred materials, include aluminum and copper for superfine grained aluminum and copper sputtering targets; aluminum, copper, cobalt, tantalum, zirconium, and titanium for use in 200 mm and 300 mm sputtering targets, along with other mm-sized targets; and aluminum for use in aluminum sputtering targets that deposit a thin, high conformal "seed" layer of aluminum onto surface layers. It should be understood that the phrase "and combinations thereof" is herein used to mean that there may be metal impurities in some of the sputtering targets, such as a copper sputtering target with chromium and aluminum impurities, or there may be an intentional combination of metals and other materials that make up the sputtering target, such as those targets comprising alloys, borides, carbides, fluorides, nitrides, silicides, oxides and others. Materials contemplated herein also comprise those materials described in commonly-owned PCT Application Serial No.: PCT/US05/13663 entitled "Novel Ruthenium Alloys, Their Use in Vapor Deposition or Atomic Layer Deposition and Films Produced Therefrom", which was filed on Apr. 21, 2005 and which is incorporated herein in its entirety by reference.

The term "metal" also includes alloys, metal/metal composites, metal ceramic composites, metal polymer composites, as well as other metal composites. Alloys contemplated herein comprise gold, antimony, arsenic, boron, copper, germanium, nickel, indium, palladium, phosphorus, silicon, cobalt, vanadium, iron, hafnium, titanium, iridium, zirconium, tungsten, silver, platinum, tantalum, tin, zinc, lithium, manganese, rhenium, and/or rhodium. Specific alloys include gold antimony, gold arsenic, gold boron, gold copper, gold germanium, gold nickel, gold nickel indium, gold palladium, gold phosphorus, gold silicon, gold silver platinum, gold tantalum, gold tin, gold zinc, palladium lithium, palladium manganese, palladium nickel, platinum palladium, palladium rhenium, platinum rhodium, silver arsenic, silver copper, silver gallium, silver gold, silver palladium, silver titanium, titanium zirconium, aluminum copper, aluminum silicon, aluminum silicon copper, aluminum titanium, chromium copper, chromium manganese palladium, chromium manganese platinum, chromium molybdenum, chromium ruthenium, cobalt platinum, cobalt zirconium niobium, cobalt zirconium rhodium, cobalt zirconium tantalum, copper nickel, iron aluminum, iron rhodium, iron tantalum, chromium silicon oxide, chromium vanadium, cobalt chromium, cobalt chromium nickel, cobalt chromium platinum, cobalt chromium tantalum, cobalt chromium tantalum platinum, cobalt iron, cobalt iron boron, cobalt iron chromium, cobalt iron zirconium, cobalt nickel, cobalt nickel chromium, cobalt nickel iron, cobalt nickel hafnium, cobalt niobium hafnium, cobalt niobium iron, cobalt niobium titanium, iron tantalum chromium, manganese iridium, manganese palladium platinum, manganese platinum, manganese rhodium, manganese ruthenium, nickel chromium, nickel chromium silicon, nickel cobalt iron, nickel iron, nickel iron chromium, nickel iron rhodium, nickel iron zirconium, nickel manganese, nickel vanadium, tungsten titanium and/or combinations thereof.

As far as other materials that are contemplated herein for sputtering targets, catch-rings and/or other related particle generation apparatus, the following combinations are considered examples of contemplated sputtering targets, coils and/or bosses (although the list is not exhaustive): chromium boride, lanthanum boride, molybdenum boride, niobium boride, tantalum boride, titanium boride, tungsten boride, vanadium boride, zirconium boride, boron carbide, chromium carbide, molybdenum carbide, niobium carbide, silicon carbide, tantalum carbide, titanium carbide, tungsten carbide, vanadium carbide, zirconium carbide, aluminum fluoride, barium fluoride, calcium fluoride, cerium fluoride, cryolite, lithium fluoride, magnesium fluoride, potassium fluoride, rare earth fluorides, sodium fluoride, aluminum nitride, boron nitride, niobium nitride, silicon nitride, tantalum nitride, titanium nitride, vanadium nitride, zirconium nitride, chromium silicide, molybdenum silicide, niobium silicide, tantalum silicide, titanium silicide, tungsten silicide, vanadium silicide, zirconium silicide, aluminum oxide, antimony oxide, barium oxide, barium titanate, bismuth oxide, bismuth titanate, barium strontium titanate, chromium oxide, copper oxide, hafnium oxide, magnesium oxide, molybdenum oxide, niobium pentoxide, rare earth oxides, silicon dioxide, silicon monoxide, strontium oxide, strontium titanate, tantalum pentoxide, tin oxide, indium oxide, indium tin oxide, lanthanum aluminate, lanthanum oxide, lead titanate, lead zirconate, lead zirconate-titanate, titanium aluminide, lithium niobate, titanium oxide, tungsten oxide, yttrium oxide, zinc oxide, zirconium oxide, bismuth telluride, cadmium selenide, cadmium telluride, lead selenide, lead sulfide, lead telluride, molybdenum selenide, molybdenum sulfide, zinc selenide, zinc sulfide, zinc telluride and/or combinations thereof.

Thin layers or films produced by the sputtering of atoms or molecules from targets discussed herein can be formed on any number or consistency of layers, including other metal layers, substrate layers, dielectric layers, hardmask or etchstop layers, photolithographic layers, anti-reflective layers, etc. In some preferred embodiments, the dielectric layer may comprise dielectric materials contemplated, produced or disclosed by Honeywell International, Inc. including, but not limited to: a) FLARE (polyarylene ether), such as those compounds disclosed in issued U.S. Pat. Nos. 5,959,157, 5,986,045, 6,124,421, 6,156,812, 6,172,128, 6,171,687, 6,214,746, and pending application Ser. Nos. 09/197,478, 09/538,276, 09/544,504, 09/741,634, 09/651,396, 09/545,058, 09/587,851, 09/618,945, 09/619,237, 09/792,606, b) adamantane-based materials, such as those shown in pending application Ser. No. 09/545,058; Serial PCT/US01/22204 filed Oct. 17, 2001; PCT/US01/50182 filed Dec. 31, 2001; 60/345,374 filed Dec. 31, 2001; 60/347,195 filed Jan. 8, 2002; and 60/350,187 filed Jan. 15, 2002, c) commonly assigned U.S. Pat. Nos. 5,115,082; 5,986,045; and 6,143,855; and commonly assigned International Patent Publications WO 01/29052 published Apr. 26, 2001; and WO 01/29141 published Apr. 26, 2001; and (d) nanoporous silica materials and silica-based compounds, such as those compounds disclosed in issued U.S. Pat. Nos. 6,022,812, 6,037,275, 6,042,994, 6,048,804, 6,090,448, 6,126,733, 6,140,254, 6,204,202, 6,208,014, and pending application Ser. Nos. 09/046,474, 09/046,473, 09/111,084, 09/360,131, 09/378,705, 09/234,609, 09/379,866, 09/141,287, 09/379,484, 09/392,413, 09/549,659, 09/488,075, 09/566,287, and 09/214,219 all of which are incorporated by reference herein in their entirety and (e) Honeywell HOSP® organosiloxane.

The wafer or substrate may comprise any desirable substantially solid material. Particularly desirable substrates would comprise glass, ceramic, plastic, metal or coated metal, or composite material. In preferred embodiments, the substrate comprises a silicon or germanium arsenide die or wafer surface, a packaging surface such as found in a copper, silver, nickel or gold plated leadframe, a copper surface such as found in a circuit board or package interconnect trace, a via-wall or stiffener interface ("copper" includes considerations of bare copper and its oxides), a polymer-based packaging or board interface such as found in a polyimide-based flex package, lead or other metal alloy solder ball surface, glass and polymers such as polyimides. In more preferred embodiments, the substrate comprises a material common in the packaging and circuit board industries such as silicon, copper, glass, or a polymer.

The substrate layer may also comprise a plurality of voids if it is desirable for the material to be nanoporous instead of continuous. Voids are typically spherical, but may alternatively or additionally have any suitable shape, including tubular, lamellar, discoidal, or other shapes. It is also contemplated that voids may have any appropriate diameter. It is further contemplated that at least some of the voids may connect with adjacent voids to create a structure with a significant amount of connected or "open" porosity. The voids preferably have a mean diameter of less than 1 micrometer, and more preferably have a mean diameter of less than 100 nanometers, and still more preferably have a mean diameter of less than 10 nanometers. It is further contemplated that the voids may be uniformly or randomly dispersed within the substrate layer. In a preferred embodiment, the voids are uniformly dispersed within the substrate layer.

The surface provided is contemplated to be any suitable surface, as discussed herein, including a wafer, substrate, dielectric material, hardmask layer, other metal, metal alloy or metal composite layer, antireflective layer or any other suitable layered material. The coating, layer or film that is produced on the surface may also be any suitable or desirable thickness—ranging from one atom or molecule thick (less than 1 nanometer) to millimeters in thickness.

Wafers and layered materials (stacks) produced from the sputtering systems described herein can be incorporated into any process or production design that produces, builds or otherwise modifies electronic, semiconductor and communication/data transfer components. Electronic, semiconductor and communication components as contemplated herein, are generally thought to comprise any layered component that can be utilized in an electronic-based, semiconductor-based or communication-based product. Contemplated components comprise micro chips, circuit boards, chip packaging, separator sheets, dielectric components of circuit boards, printed-wiring boards, touch pads, wave guides, fiber optic and photon-transport and acoustic-wave-transport components, any materials made using or incorporating a dual damascene process, and other components of circuit boards, such as capacitors, inductors, and resistors.

Electronic-based, semiconductor-based and communications-based/data transfer-based products can be "finished" in the sense that they are ready to be used in industry or by other consumers. Examples of finished consumer products are a television, a computer, a cell phone, a pager, a palm-type organizer, a portable radio, a car stereo, and a remote control. Also contemplated are "intermediate" products such as circuit boards, chip packaging, and keyboards that are potentially utilized in finished products.

Electronic, semiconductor and communication/data transfer products may also comprise a prototype component, at any stage of development from conceptual model to final scale-up mock-up. A prototype may or may not contain all of the actual components intended in a finished product, and a prototype may have some components that are constructed out of composite material in order to negate their initial effects on other components while being initially tested.

EXAMPLE

Comparison of Conventional and Field-Enhanced Targets

Figure 18:
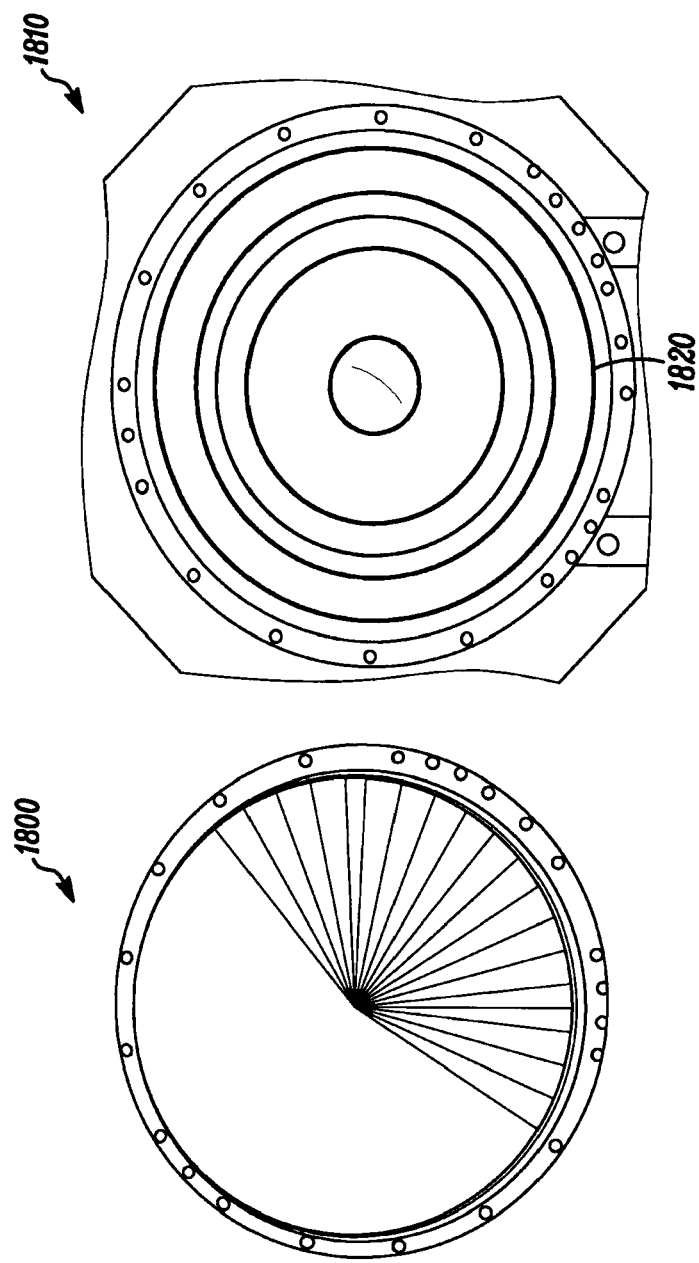
FIG. 18 shows a typical erosion profile 1820 for a standard target before 1800 and after 800 kWh 1810.

FIG. 18 shows a typical erosion profile 1820 for a standard target before 1800 and after 800 kWh 1810. The erosion profile of the standard target is dictated by the configuration of the magnets behind the target. A standard magnet 1910, which is designed to optimize film uniformity, is shown in FIG. 19. However, these fixed magnets have a limited capacity in controlling plasma distribution.

As a contrast, FIG. 20 shows a new conventional or standard target 2000 and the design of a new field-enhanced target 2010. Not only is the field-enhanced target better for these types of applications, as will be shown by the data, but they also use, in some embodiments, about 15% less material than the standard target, as shown by the weight in grams. FIG. 21 shows the surface contours/erosion profiles of a conventional or standard target 2100 and a field-enhanced target after 800 kWh 2110. The standard target shows preferential erosion where the magnetic field is stronger, whereas the field-enhanced target shows uniform erosion, because both magnetic and electric field strength control the erosion.

FIGS. 22A and 22B show I-V variation versus target life for a standard target and a field-enhanced target. The results for a standard target, shown in FIG. 22A, shows an increasing shift in I-V curves as the target erodes. The surface are of the target increases as erosion grooves develop. The increased area (current path) allows higher current flow resulting in reduced operating voltage. The results for a field-enhanced target, shown in FIG. 22B, delivers almost invariant I-V performance with target erosion. The overall operating voltage is slightly higher than that of the standard target because of the enhanced field strength by pre-grooving, which increases the operating voltage. Pre-grooving makes the target surface area change slowly with target erosion, resulting in almost invariant I-V characteristics.

FIGS. 23A and 23B show deposition rate versus power at various target lives for a standard target and a field-enhanced target. The standard target shows a decreasing trend of deposition rate with target erosion, mainly because of the increasing fraction of re-deposition in the deepening erosion grooves. The field-enhanced target shows very little change in deposition rate with target erosion. It is possible that the field-enhanced target may not require power or time compensation with target erosion.

FIGS. 24A and 24B show the erosion profile versus life of both a standard target and a field-enhanced target at 800 kWh. The field-enhanced target showed 33% more materials left at the peak erosion area than the standard target. FIG. 25 shows a comparison of the erosion profile at 800 kWh of the standard and field-enhanced targets. The field-enhanced target shows 2.9 mm (31%) less erosion after 800 kWh than the standard target. FIG. 26 shows a comparison of the erosion thickness at 800 kWh of the standard and field-enhanced targets. The field-enhanced target erodes more uniformly than the standard target and therefore extends the target life. The field-enhanced target can control both the erosion profile and the film uniformity. FIG. 27 shows the erosion thickness of a field-enhanced aluminum target at 400 kWh and 800 kWh. The circled area in the graph shows clear evidence for erosion near the edge area of the target, suggesting that nodule formation can be suppressed by enhancing the electric-field strength at the edge area. Table 1 shows material distribution after 800 kWh. Both the standard and the field-enhanced targets show similar efficiency in material usage, but the field-enhanced target deposited 6% more material and left 30% more material in thickness because of uniform erosion, resulting in extended target life. Based on this data, 1000 kWh and 1200 kWh can be achieved without increasing overall target thickness to optimize kit change cycle.

Based on the experimental data, it has been shown that a) the field-enhanced targets show less variation in I-V curve and deposition rate with target life, b) recalibration of the deposition parameter (e.g. power or time compensation) may not be needed with target life, c) the electric field of a target surface and thus the erosion profile can be controlled via target surface contour without modifying the system configuration, d) the erosion profile is determined by the existing system magnets and the electric field strength at the target surface, the latter being controlled by the target manufacturer, and e) film uniformity can be controlled via target surface contour.

Thus, specific embodiments and applications of the design and use of DC magnetron sputtering systems have been disclosed. It should be apparent, however, to those skilled in the art that many more modifications besides those already described are possible without departing from the inventive concepts herein. The inventive subject matter, therefore, is not to be restricted except in the spirit of the specification disclosed herein. Moreover, in interpreting the specification, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

We claim:

1. A field-enhanced sputtering target comprising a sputtering material having a non-planar sputtering surface prior to erosion by use in a sputtering system, the non-planar sputtering surface having at least one field-enhanced, protruding convex curvature feature positioned at a location corresponding to at least one poorly eroding area of the non-planar sputtering surface, the at least one poorly eroding area defined as an area corresponding to a reference, protruding convex curvature feature of an erosion profile of a reference sputtering target following erosion by use in a sputtering system, the reference sputtering target comprising a sputtering material having an identical composition as the sputtering material of the field-enhanced sputtering target, the reference sputtering target further comprising a planar sputtering surface prior to erosion by use in a sputtering system.

2. The field-enhanced sputtering target of claim 1, wherein the field-enhanced sputtering target is circular in shape and includes a center, and the at least one field-enhanced, protruding convex curvature feature is positioned proximate an outer radial edge of the sputtering surface of the field-enhanced sputtering target.

3. The field-enhanced sputtering target of claim 1, wherein the field-enhanced sputtering target further comprises at least one recessed sidewall groove.

4. The field-enhanced sputtering target of claim 1, wherein the field-enhanced sputtering target further comprises a backing plate comprising a grooved flange.

5. The field-enhanced sputtering target of claim 4, wherein the grooved flange is recessed.

6. The field-enhanced sputtering target of claim 1, further comprising at least one additional field-enhanced, protruding convex curvature feature positioned at a location corresponding to at least one high erosion area of the non-planar sputtering surface of the field-enhanced sputtering target, the at least one high erosion area defined as an area corresponding to a non-protruding concave curvature feature of the erosion profile of the reference sputtering target.

7. The field-enhanced sputtering target of claim 1, wherein the sputtering material of the reference sputtering target includes a first thickness and the at least one field-enhanced sputtering target includes a second thickness at a peak of the field-enhanced, protruding convex curvature feature, the first and second thicknesses being substantially equal.

8. The field-enhanced sputtering target of claim 1, wherein the sputtering material of the reference sputtering target includes a first thickness and the at least one field-enhanced sputtering target includes a second thickness at a peak of the field-enhanced, protruding convex curvature feature, the first thickness being less than the second thickness.

9. The field-enhanced sputtering target of claim 1, wherein the sputtering material of the reference sputtering target includes a first thickness and the at least one field-enhanced sputtering target includes a second thickness at a peak of the field-enhanced, protruding convex curvature feature, the first thickness being greater than the second thickness.

10. The field-enhanced sputtering target of claim 1, wherein the field-enhanced sputtering target is circular in shape and includes a center, and the at least one field-enhanced, protruding convex curvature feature comprises a first annular convex curvature.

11. The field-enhanced sputtering target of claim 10, wherein the at least one field-enhanced, protruding convex curvature feature further comprises a second annular convex curvature feature, the second annular convex curvature feature disposed radially outwardly of the first annular convex curvature feature and positioned at a location corresponding to at least one poorly eroding area of the non-planar sputtering surface of field-enhanced sputtering target.

12. The field-enhanced sputtering target of claim 11, wherein the second annular convex curvature feature is positioned at an outer radial edge of the sputtering surface of the field-enhanced sputtering target.

13. The field-enhanced sputtering target of claim 10, wherein the erosion profile of the reference sputtering target comprises an annular non-protruding concave curvature feature, and the at least one field-enhanced, protruding convex curvature feature further comprises a second annular convex curvature feature positioned at a location corresponding to the annular non-protruding concave curvature feature of the erosion profile of the reference sputtering target.

14. The field-enhanced sputtering target of claim 2, wherein the at least one field-enhanced, protruding convex curvature feature further comprises an intermediate annular convex curvature feature disposed radially between the center and the outer radial edge, the intermediate annular convex curvature feature disposed at a radial extent from the center which corresponds to at least one reference, protruding convex curvature feature on the erosion profile of the reference sputtering target.

15. A method of producing a field-enhanced sputtering target, said method comprising the steps of:
identifying at least one reference, protruding convex curvature feature on an erosion profile of a reference sputtering target following erosion by use in a sputtering system, the reference sputtering target comprising a sputtering material and a planar surface prior to erosion by use in a sputtering system; and
manufacturing a field-enhanced sputtering target, the field-enhanced sputtering target comprising a sputtering material having an identical composition as the sputtering material of the reference sputtering target, the field-enhanced sputtering target having a non-planar sputtering surface prior to erosion by use in a sputtering system, and the non-planar sputtering surface of the field-enhanced sputtering target further having at least one field-enhanced, protruding convex curvature feature positioned at a location corresponding to at least one reference, protruding convex curvature feature of the erosion profile of the reference sputtering target.

16. The method of claim 15, further comprising the additional steps of:
identifying at least one non-protruding concave curvature feature on the erosion profile of the reference sputtering target, and wherein said manufacturing step further comprises:
manufacturing the field-enhanced sputtering target to further comprise at least one additional field-enhanced, protruding convex curvature feature positioned at a location corresponding to at least one non-protruding concave curvature feature of the erosion profile of the reference sputtering target.

17. The method of claim 15, wherein said manufacturing step further comprises:
manufacturing the field-enhanced sputtering target as circular in shape and including a center, with the at least one field-enhanced, protruding convex curvature feature being a first annular convex curvature feature.

18. The method of claim 17, wherein the at least one field-enhanced, protruding convex curvature feature further comprises a second annular convex curvature feature, the second annular convex curvature feature disposed radially outwardly of the first annular convex curvature feature and positioned at a location corresponding to at least one poorly eroding area of the non-planar sputtering surface of the field-enhanced sputtering target.

19. The method of claim 18, wherein the second annular convex curvature feature is positioned at an outer radial edge of the sputtering surface of the field-enhanced sputtering target.

20. The method of claim 15, wherein said manufacturing step further comprises:
manufacturing the field-enhanced sputtering target as circular in shape and including a center, with the at least one field-enhanced, protruding convex curvature feature positioned proximate an outer radial edge of the sputtering surface of the field-enhanced sputtering target.

* * * * *

UNITED STATES PATENT AND TRADEMARK OFFICE
CERTIFICATE OF CORRECTION

PATENT NO. : 8,398,833 B2  
APPLICATION NO. : 12/988016  
DATED : March 19, 2013  
INVENTOR(S) : Eal H. Lee et al.

Page 1 of 1

It is certified that error appears in the above-identified patent and that said Letters Patent is hereby corrected as shown below:

In the Claims  
In Claim 7, Column 16, line 61, please delete the words "at least one"  
In Claim 8, Column 16, line 67, please delete the words "at least one"  
In Claim 9, Column 17, line 6, please delete the words "at least one"

Signed and Sealed this  
Thirty-first Day of December, 2013

Margaret A. Focarino  
*Commissioner for Patents of the United States Patent and Trademark Office*